US010897118B2

(12) United States Patent
Kurosawa

(10) Patent No.: US 10,897,118 B2
(45) Date of Patent: Jan. 19, 2021

(54) LASER APPARATUS AND EXTREME ULTRAVIOLET LIGHT GENERATING SYSTEM

(71) Applicant: Gigaphoton Inc., Tochigi (JP)

(72) Inventor: Yoshiaki Kurosawa, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 16/052,658

(22) Filed: Aug. 2, 2018

(65) Prior Publication Data

US 2018/0375283 A1    Dec. 27, 2018

Related U.S. Application Data

(63) Continuation of application No. PCT/JP2016/056511, filed on Mar. 2, 2016.

(51) Int. Cl.
*H01S 3/23* (2006.01)
*H01S 3/104* (2006.01)
(Continued)

(52) U.S. Cl.
CPC ........ *H01S 3/2375* (2013.01); *G03F 7/70025* (2013.01); *G03F 7/70033* (2013.01);
(Continued)

(58) Field of Classification Search
CPC ... H05G 2/008; G03F 7/70025; G03F 7/7033; H01S 3/2308–235;
(Continued)

(56) References Cited

U.S. PATENT DOCUMENTS 5,812,569 A    9/1998  Walker et al.
6,414,980 B1 *  7/2002  Wang ...................... H01S 3/117
                                                        372/92
(Continued)

FOREIGN PATENT DOCUMENTS

JP    H02-043782 A    2/1990
JP    H05-167162 A    7/1993
(Continued)

OTHER PUBLICATIONS

International Search Report issued in PCT/JP2016/056511; dated May 31, 2016.
(Continued)

*Primary Examiner* — Joshua King
(74) *Attorney, Agent, or Firm* — Studebaker & Brackett PC

(57) ABSTRACT

The laser apparatus includes a master oscillator, an amplifier, a power source, and a controller to control the power source. The controller controls the power source such that an excitation intensity of the amplifier in a burst oscillation period performing the burst oscillation is a first excitation intensity, controls the power source such that, if the predetermined repetition frequency is a first repetition frequency, an excitation intensity of the amplifier in a suspension period suspending the burst oscillation is a second excitation intensity equal to or lower than the first excitation intensity, and controls the power source such that, if the predetermined repetition frequency is a second repetition frequency higher than the first repetition frequency, the excitation intensity of the amplifier in the suspension period is a third excitation intensity lower than the second excitation intensity.

15 Claims, 14 Drawing Sheets

(51) Int. Cl.
*H01S 3/10* (2006.01)
*H01S 5/0683* (2006.01)
*H01S 3/00* (2006.01)
*H01S 5/34* (2006.01)
*H01S 3/223* (2006.01)
*H01S 5/40* (2006.01)
*H01S 3/134* (2006.01)
*H05G 2/00* (2006.01)
*G03F 7/20* (2006.01)

(52) U.S. Cl.
CPC .......... *H01S 3/104* (2013.01); *H01S 3/10038* (2013.01); *H01S 3/2308* (2013.01); *H01S 5/0683* (2013.01); *H05G 2/008* (2013.01); H01S 3/0085 (2013.01); H01S 3/10046 (2013.01); H01S 3/134 (2013.01); H01S 3/2232 (2013.01); H01S 3/2316 (2013.01); H01S 5/3401 (2013.01); H01S 5/4087 (2013.01)

(58) Field of Classification Search
CPC ...... H01S 3/10007–1003; H01S 3/1301–1302; H01S 3/10038–10046; H01S 3/1306; H01S 3/10084–10092; H01S 5/06835; H01S 5/06832; H01S 5/0625; H01S 5/06253; H01S 5/06213; H01S 5/06216; H01S 5/0656; H01S 5/50–509
See application file for complete search history.

(56) References Cited

U.S. PATENT DOCUMENTS

| | | | | |
|---|---|---|---|---|
| 6,901,090 B1* | 5/2005 | Ohtsuki | ................... | G02F 1/37 372/21 |
| 2005/0225846 A1* | 10/2005 | Nati | ................... | H01S 3/1112 359/341.1 |
| 2008/0024859 A1* | 1/2008 | Tamaoki | ................... | H04B 10/296 359/341.31 |
| 2008/0204860 A1* | 8/2008 | Rapp | ................... | H04B 10/291 359/341.3 |
| 2009/0232171 A1* | 9/2009 | Abe | ................... | H01S 3/2232 372/25 |
| 2010/0183040 A1* | 7/2010 | Ishizu | ................... | B23K 26/0622 372/25 |
| 2011/0019705 A1* | 1/2011 | Adams | ................... | B23K 26/0622 372/25 |
| 2012/0300288 A1* | 11/2012 | Ogaki | ................... | H01S 3/1306 359/337.11 |
| 2012/0300289 A1 | 11/2012 | Ogaki | | |
| 2012/0307851 A1* | 12/2012 | Hori | ................... | H01S 3/2308 372/27 |
| 2013/0034113 A1* | 2/2013 | Oba | ................... | H01S 3/0675 372/6 |
| 2013/0051412 A1* | 2/2013 | Miyao | ................... | G03F 7/70025 372/31 |
| 2013/0099140 A1* | 4/2013 | Nakarai | ................... | H01S 3/0057 250/493.1 |
| 2013/0336651 A1 | 12/2013 | Bato et al. | | |
| 2015/0070753 A1* | 3/2015 | Knappe | ................... | H01S 3/11 359/340 |
| 2015/0263481 A1* | 9/2015 | Fanning | ................... | H01S 3/06758 219/121.61 |
| 2015/0318660 A1* | 11/2015 | Oba | ................... | H01S 3/0675 372/6 |
| 2016/0197451 A1* | 7/2016 | Kraemer | ................... | H01S 3/2308 372/25 |

FOREIGN PATENT DOCUMENTS

| | | |
|---|---|---|
| JP | H09-248682 A | 9/1997 |
| JP | 2000-306820 A | 11/2000 |
| JP | 2000-340872 A | 12/2000 |
| JP | 2010-171131 A | 8/2010 |
| JP | 2012-186433 A | 9/2012 |
| JP | 2012-191171 A | 10/2012 |
| JP | 2012-216768 A | 11/2012 |
| JP | 2012-248614 A | 12/2012 |
| JP | 2012-248615 A | 12/2012 |
| JP | 2013-258643 A | 12/2013 |

OTHER PUBLICATIONS

International Preliminary Report on Patentability (Chapter I) and Written Opinion of the International Searching Authority; PCT/JP2016/056511; dated Sep. 4, 2018.

An Office Action dated by the Japanese Patent Office dated Mar. 3, 2020, which corresponds to Japanese Patent Application No. 2018-502951 and is related to U.S. Appl. No. 16/052,658.

* cited by examiner

| REPETITION FREQUENCY | EXCITATION INTENSITY IN SUSPENSION PERIOD / EXCITATION INTENSITY IN BURST OSCILLATION PERIOD | | |
|---|---|---|---|
| | FIRST AMPLIFIER | SECOND AMPLIFIER | THIRD AMPLIFIER |
| 100 kHz | 30 % | 40 % | 80 % |
| 50 kHz | 80 % | 80 % | 80 % |
| 20 kHz | 90 % | 90 % | 90 % |

LASER APPARATUS AND EXTREME ULTRAVIOLET LIGHT GENERATING SYSTEM

TECHNICAL FIELD

The present disclosure relates to a laser apparatus and an extreme ultraviolet light generating system.

BACKGROUND ART

In recent years, as semiconductor processes become finer, transfer patterns for use in photolithography of semiconductor processes have rapidly become finer. In the next generation, micro-fabrication at 70 nm to 45 nm, and further, micro-fabrication at 32 nm or less would be demanded. In order to meet the demand for, for example, micro-fabrication at 32 nm or less, it is expected to develop an exposure apparatus in which an extreme ultraviolet light generating apparatus for generating extreme ultraviolet (EUV) light at a wavelength of approximately 13 nm is combined with a reduced projection reflective optical system.

Three types of EUV light generating apparatuses have been proposed, which include an LPP (laser produced plasma) type apparatus using plasma generated by irradiating target material with a pulse laser beam, a DPP (discharge produced plasma) type apparatus using plasma generated by an electric discharge, and an SR (synchrotron radiation) type apparatus using synchrotron radiation.

Patent Document 1: US Patent Application Publication No. 2013/051412 A
Patent Document 2: US Patent Application Publication. No. 2009/232171 A
Patent Document 3: Japanese Patent Application Publication No. H09-248682 A

SUMMARY

A laser apparatus according to an aspect of the present disclosure may include: a master oscillator configured to alternately repeat burst oscillation to perform output of a pulse laser beam at a predetermined repetition frequency and suspension of the burst oscillation to suspend the output of the pulse laser beam at the predetermined repetition frequency; an amplifier provided in an optical path of the pulse laser beam outputted from the master oscillator; a power source configured to supply electric power to the amplifier; and a controller configured to control the power source such that an excitation intensity of the amplifier in a burst oscillation period performing the burst oscillation is a first excitation intensity, control the power source such that, if the predetermined repetition frequency is a first repetition frequency, an excitation intensity of the amplifier in a suspension period suspending the burst oscillation is a second excitation intensity equal to or lower than the first excitation intensity, and control the power source such that, if the predetermined repetition frequency is a second repetition frequency higher than the first repetition frequency, the excitation intensity of the amplifier in the suspension period is a third excitation intensity lower than the second excitation intensity.

An extreme ultraviolet light generating system according to another aspect of the present disclosure may include: a target supply unit configured to output a target toward a predetermined region; and a laser apparatus configured to output a pulse laser beam with which the target is irradiated, the laser apparatus including: a master oscillator configured to alternately repeat burst oscillation to perform output of the pulse laser beam at a predetermined repetition frequency and suspension of the burst oscillation to suspend the output of the pulse laser beam at the predetermined repetition frequency; an amplifier provided in an optical path of the pulse laser beam outputted from the master oscillator; a power source configured to supply electric power to the amplifier; and a controller configured to control the power source such that an excitation intensity of the amplifier in a burst oscillation period performing the burst oscillation is a first excitation intensity, control the power source such that, if the predetermined repetition frequency is a first repetition frequency, an excitation intensity of the amplifier in a suspension period suspending the burst oscillation is a second excitation intensity equal to or lower than the first excitation intensity, and control the power source such that, if the predetermined repetition frequency is a second repetition frequency higher than the first repetition frequency, the excitation intensity of the amplifier in the suspension period is a third excitation intensity lower than the second excitation intensity.

BRIEF DESCRIPTION OF DRAWINGS

Embodiments of the present disclosure will be described below as mere examples with reference to the appended drawings.

DESCRIPTION OF EMBODIMENTS

Contents
1. Overall Description of EUV Light Generating System
   1.1 Configuration
   1.2 Operation
2. Laser Apparatus That Changes Excitation Intensity of Amplifier
   2.1 Configuration
   2.2 Operation
   2.3 Comparative Examples
   2.3.1 Case Where Excitation Intensity Is Constant
   2.3.2 Case Where Excitation Intensity in Suspension Period. Is Different from. That in Burst Oscillation Period
   2.4 Laser Apparatus That Changes Excitation Intensity in Suspension Period Depending on Repetition Frequency in Burst Oscillation
   2.5 Control of Excitation Intensity
   2.5.1 First Example
   2.5.2 Second Example
   2.6 Exemplary Configuration of Master Oscillator
   2.6.1 First Example
   2.6.2 Second Example
   2.6.3 Third Example
3. Laser Apparatus That Changes Excitation Intensity of Plurality of Amplifiers
   3.1 Configuration of Laser Apparatus
   3.2 Configuration of Energy Sensor
   3.3 Operation of Controller
   3.4 Setting Process of Excitation Intensity
   3.5 Adjusting Process of Excitation Intensity
   3.6 Calculating Process of Excitation Intensity
4. Configuration of Controller
5. Supplementary Explanation Embodiments of the present disclosure will be described in detail below with reference to the drawings. The embodiments described below may indicate several examples of the present disclosure and may not intend to limit the content of the present disclosure. Not all of the configurations and operations described in the embodiments are indispensable in the present disclosure. Identical reference symbols may be assigned to identical constituent elements and redundant descriptions thereof may be omitted.

1. Overall. Description of E Light Generating System
   1.1 Configuration

Figure 1:
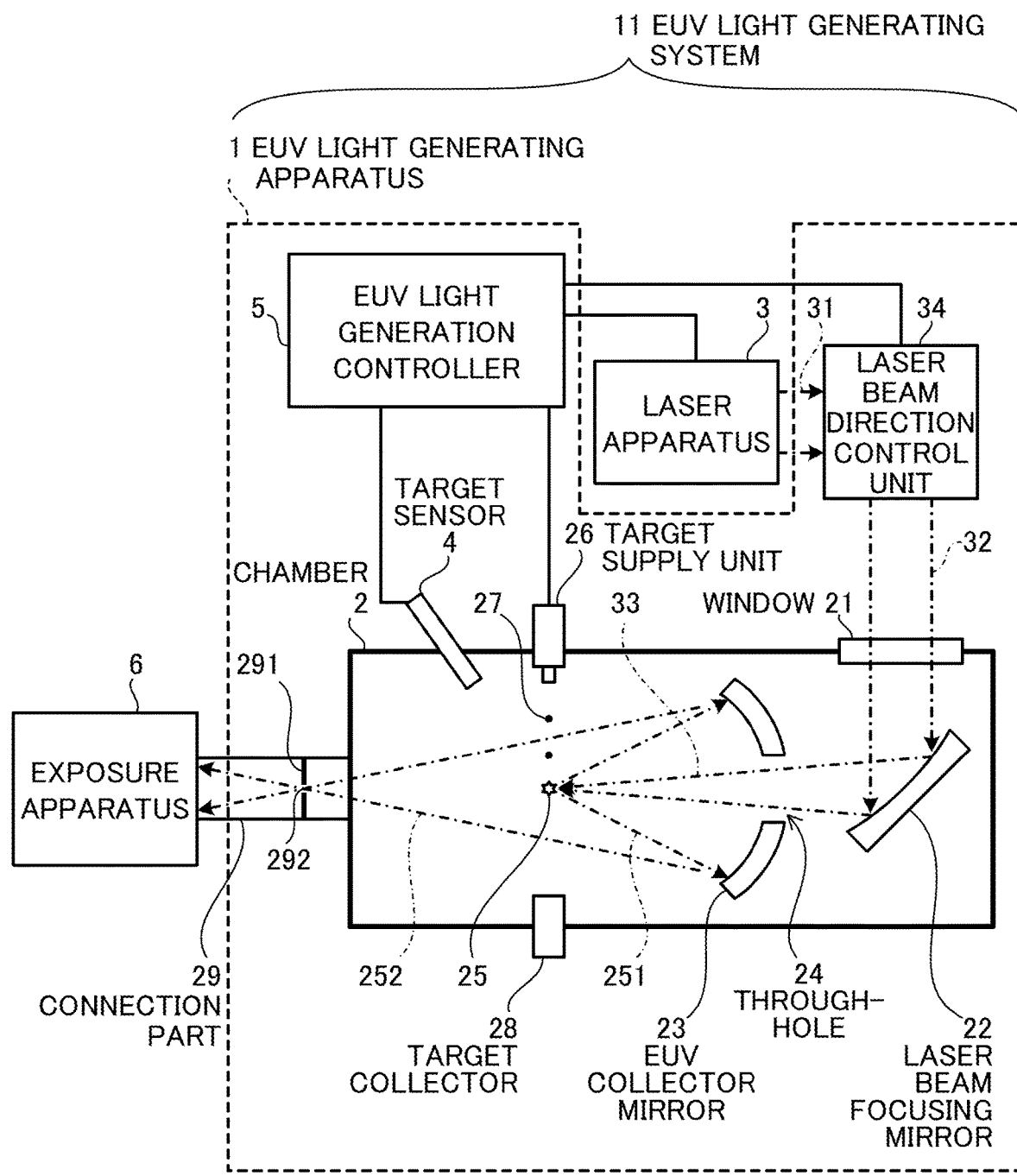
FIG. 1 schematically shows an exemplary configuration of an LPP type EUV light generating system.

FIG. 1 schematically shows an exemplary configuration of an LPP type EUV light generating system. An EUV light generating apparatus 1 may be used with at least one Laser apparatus 3. In the present application, a system including the EUV light generating apparatus 1 and the laser apparatus 3 may be referred to as an EUV light generating system 11. As shown in FIG. 1 and described in detail below, the EUV light generating apparatus 1 may include a chamber 2 and a target supply unit 26. The chamber 2 may be sealed airtight. The target supply unit 26 may be provided, for example, to penetrate a wall of the chamber 2. A target material supplied by the target supply unit 26 may include, but not be limited to, tin, terbium, gadolinium, lithium, xenon, or a combination of any two or more of them.

The chamber 2 may have at least one through-hole formed in its wall. A window 21 may be provided at the through-hole. A pulse laser beam 32 outputted from the laser apparatus 3 may be transmitted by the window 21. An EUV collector mirror 23 having a spheroidal reflective surface, for example, may be provided in the chamber 2. The EUV collector mirror 23 may have first and second focal points. The surface of the EUV collector mirror 23 may have, for example, a multi-layered reflective film in which molybdenum layers and silicon layers are alternately laminated. The EUV collector mirror 23 is preferably arranged such that, for example, the first focal point is positioned in a plasma generation region 25 and the second focal point is positioned in an intermediate focus region (IF) 292. The EUV collector mirror 23 may have a through-hole 24 at the center thereof, and a pulse laser beam 33 may pass through the through-hole 24.

The EUV light generating apparatus 1 may further include an EUV light generation controller 5, a target sensor 4, and the like. The target sensor 4 may have a photographing function and may be configured to detect the presence, actual path, position, speed or the like of a target 27.

Further, the EUV light generating apparatus 1 may include a connection part 29 for allowing the interior of the chamber 2 to be in communication with the interior of an exposure apparatus 6. In the connection part 29, a wall 291 with an aperture may be provided. The wall 291 may be positioned such that the second focal point of the EUV collector mirror 23 lies in the aperture formed in the wall 291.

Furthermore, the EUV light generating apparatus 1 may include a laser beam direction control unit 34, a laser beam focusing mirror 22, a target collector 28 for collecting the target 27, and the like. The laser beam direction control unit 34 may include an optical element for defining the traveling direction of the pulse laser beam, and an actuator for adjusting the position, the posture, or the like of the optical element.

1.2 Operation

With continued reference to FIG. 1, a pulse laser beam 31 outputted from the laser apparatus 3 may enter the laser beam direction control unit 34 and be outputted therefrom as the pulse laser beam 32. The pulse laser beam 32 may be transmitted by the window 21 to enter the chamber 2. The pulse laser beam 32 may travel inside the chamber 2 along at least one laser beam optical path, be reflected by the laser beam focusing mirror 22, and be incident on at least one target 27 as the pulse laser beam 33.

The target supply unit 26 may be configured to output the target 27 toward the plasma generation region 25 in the chamber 2. The target 27 may be irradiated with at least one pulse of the pulse laser beam 33. The target 27 irradiated with the pulse laser beam 33 may be turned into plasma that emits rays of light 251. EUV light included in the light 251 may be reflected by the EUV collector mirror 23 at a higher reflectance than light in other wavelength regions. Reflected light 252 including the EUV light reflected by the EUV collector mirror 23 may be collected at the intermediate focus region 292 and outputted to the exposure apparatus 6. Here, one target 27 may be irradiated with a plurality of pulses included in the pulse laser beam 33.

The EUV light generation controller 5 may be configured to integrally control the EUV light generating system 11. The EUV light generation controller 5 may process image data or the like of the target 27 photographed by the target sensor 4. Further, the EUV light generation controller 5 may control, for example, the timing at which the target 27 is outputted, and the direction in which the target 27 is outputted. Furthermore, the EUV light generation controller 5 may control, for example, the oscillation timing of the laser apparatus 3, the traveling direction of the pulse laser beam 32, and the focus position of the pulse laser beam 33. The various controls described above are merely examples, and other controls may be added as necessary.

Figure 2:
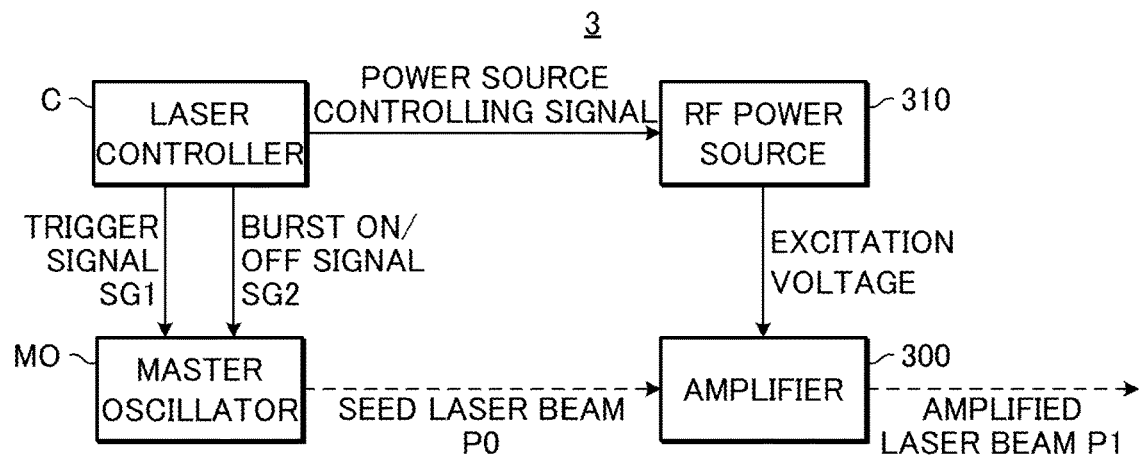
FIG. 2 is a block diagram of a laser apparatus capable of being used in a first embodiment of the present disclosure.

2. Laser Apparatus that Changes Excitation Intensity of Amplifier 2.1 Configuration FIG. 2 is a block diagram of a laser apparatus capable of being used in a first embodiment of the present disclosure. The laser apparatus 3 shown in FIG. 2 includes a master oscillator MO, an amplifier 300, an RF power source 310, and a laser controller C.

The master oscillator MO is connected via signal lines to the laser controller C. Specific examples of the configuration of the master oscillator MO will be described with reference to FIGS. 8A, 9A, and 10A. The master oscillator MO is configured to output a seed laser beam P0, which is a pulse laser beam.

The amplifier 300 is provided in an optical path of the seed laser beam P0 outputted from the master oscillator MO. The amplifier 300 may include, for example, a $CO_2$ gas laser apparatus. The $CO_2$ gas laser apparatus includes an unillustrated chamber that stores laser gas including $CO_2$ gas as a laser medium, and an unillustrated pair of electrodes configured to apply a high-frequency excitation voltage to the laser medium. The amplifier 300 is connected via a conducting member to the RF power source 310. FIG. 2 illustrates a single amplifier 300. However, as described below with reference to FIG. 11A, a plurality of amplifiers may be used.

The RF power source 310 is configured to apply the high-frequency excitation voltage to the pair of electrodes of the amplifier 300. The RF power source 310 is connected via a signal line to the laser controller C.

The laser controller C is configured to integrally control the laser apparatus 3. The laser controller C is connected to the EUV light generation controller 5 described with reference to FIG. 1 via a signal line. The laser controller C sends and receives control signals to and from the EUV light generation controller 5.

2.2 Operation

The laser controller C outputs a trigger signal SG1 to the master oscillator MO. The master oscillator MO outputs, according to the trigger signal SG1, the seed laser beam P0 at a predetermined repetition frequency.

The laser controller C outputs a burst ON/OFF signal SG2 to the master oscillator MO. The master oscillator MO performs burst operation according to the burst ON/OFF signal SG2. The burst operation means alternately repeating burst oscillation to perform output of the seed laser beam P0 at a predetermined repetition frequency, and suspension of the burst oscillation to suspend the output of the seed laser beam P0 at the predetermined repetition frequency. A burst oscillation period performing the burst oscillation corresponds, for example, to a period for exposing a region of a semiconductor wafer to form a semiconductor chip in the exposure apparatus 6 described with reference to FIG. 1. A suspension period suspending the burst oscillation corresponds, for example, to a period for moving the semiconductor wafer such that the position irradiated with the EUV light moves from a region of the semiconductor wafer to form one semiconductor chip to another region to form another semiconductor chip. Alternatively, the suspension period corresponds to a period for ejecting one semiconductor wafer that has been set in the exposure apparatus 6 and setting another semiconductor wafer. Further description will be made for the burst operation with reference to FIG. 3.

The laser controller C sends a power source controlling signal to the RF power source 310. The RF power source 310 applies, according to the power source controlling signal, the excitation voltage to the pair of electrodes of the amplifier 300. The power source controlling signal includes information for setting an excitation intensity of the amplifier 300. The excitation intensity of the amplifier 300 is set, for example, by an amplitude value of the excitation voltage applied to the pair of electrodes of the amplifier 300, or a duty ratio of the excitation voltage. The amplitude value and the duty ratio of the excitation voltage will be described with reference to FIGS. 6A to 7F.

The excitation voltage applied to the pair of electrodes of the amplifier 300 causes an electric discharge between the pair of electrodes of the amplifier 300. The electric discharge excites the laser medium and the laser medium shifts to a high energy level. Inputting the seed laser beam P0 outputted from the master oscillator MO to the pair of electrodes of the amplifier 300 causes the seed laser beam P0 to be amplified and be outputted as an amplified laser beam P1 from the amplifier 300. The amplified laser beam. P1 may enter the laser beam direction control unit 34 as the pulse laser beam 31 described with reference to FIG. 1.

2.3 Comparative Examples 2.3.1 Case where Excitation Intensity is Constant

Figure 3:
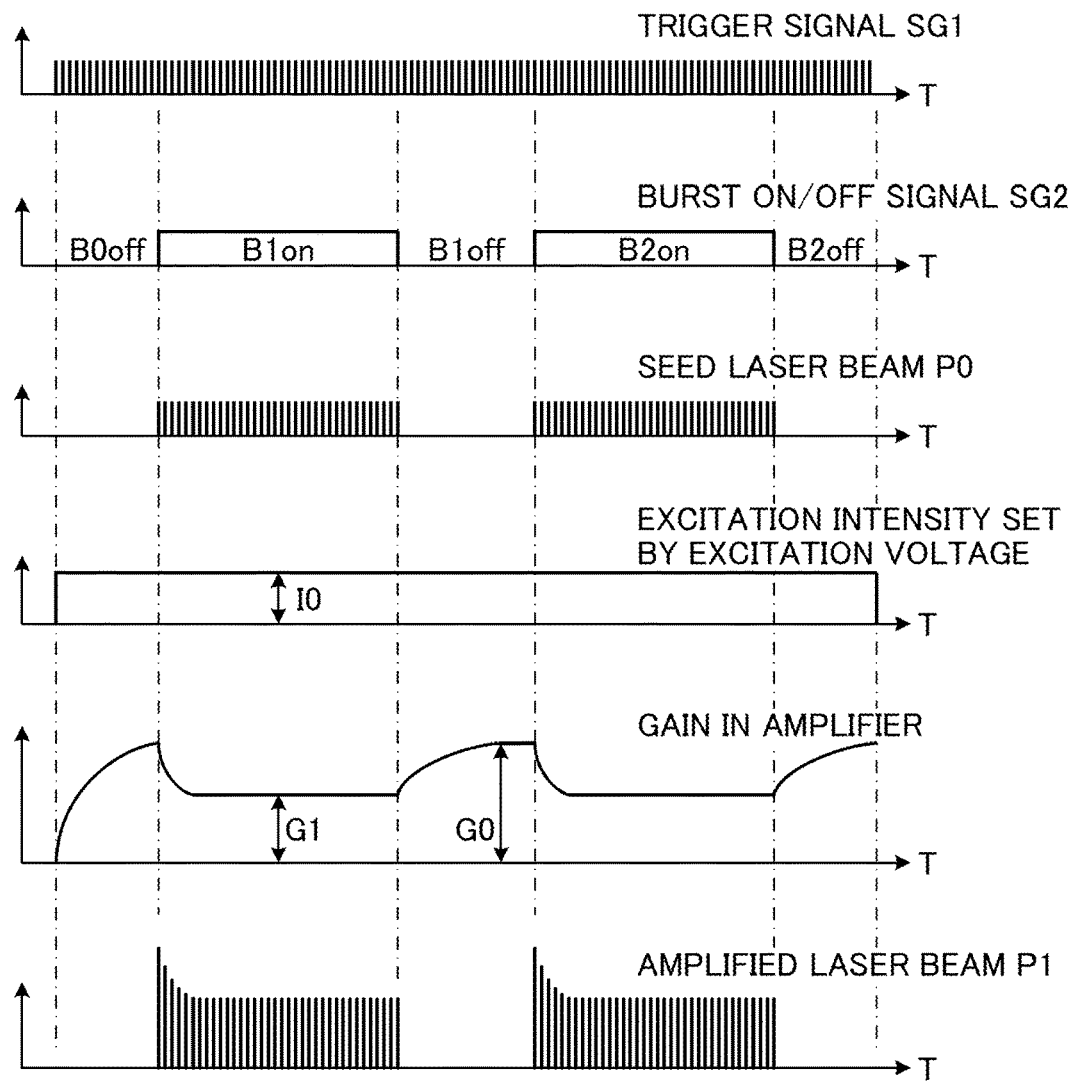
FIG. 3 is a timing chart of a laser apparatus according to a first comparative example.

FIG. 3 is a timing chart of a laser apparatus according to a first comparative example. Each of the horizontal axes in FIG. 3 shows the time T. Dot and dash lines parallel to the vertical axes in FIG. 3 show that the events connected by each of the dot and dash lines occur at substantially the same time with each other. The laser apparatus 3 described with reference to FIG. 2 is also used in the first comparative example.

The trigger signal SG1 is a pulsed signal outputted at a predetermined repetition frequency as shown in FIG. 3.

The burst ON/OFF signal SG2 is, as shown in FIG. 3, a rectangular wave signal that represents the burst oscillation periods B1on and B2on in an ON state and the suspension periods B0off, B1off, and B2off in an OFF state.

The trigger signal SG1 and the burst ON/OFF signal SG2 inputted to the master oscillator MO cause the master oscillator MO to output the seed laser beam P0 shown in FIG. 3. The seed laser beam P0 is outputted in the burst oscillation periods B1on and B2on defined by the burst ON/OFF signal SG2 at a predetermined repetition frequency defined by the trigger signal SG1. The seed laser beam P0 is not outputted in the suspension periods B0off, B1off, and B2off defined by the burst ON/OFF signal SG2.

In the first comparative example, the excitation intensity of the amplifier 300 set by the excitation voltage is set to an excitation intensity I0 in both the burst oscillation periods B1on and B2on and the suspension periods B0off, B1off, and B2off. Namely, the excitation intensity of the amplifier 300 is a constant value.

In that case, in the suspension periods B0off, B1off, and B2off, the gain in the amplifier 300 gradually accumulates approximately up to a gain G0.

In contrast, in the burst oscillation periods B1on and B2on, the gain in the amplifier 300 is consumed by amplifying the seed laser beam P0. The gain in the amplifier 300 gradually decreases down to a gain G1 less than the gain G0. At the gain G1 of the amplifier 300, the amount of energy supplied to the amplifier 300 by the excitation voltage is substantially balanced with the amount of energy consumed by amplifying the seed laser beam P0.

In the first comparative example, the gain in the amplifier 300 decreases at the start of each of the burst oscillation periods B1on and B2on from the gain G0 to the gain G1. The pulse energy of the amplified laser beam. P1 may thus have a high value at the start of each of the burst oscillation periods B1on and B2on, and then decrease to a low value. In the first comparative example, the pulse energy of the amplified laser beam P1 in the burst oscillation periods B1on and B2on is unstable. In the EUV light generating system 11 described with reference to FIG. 1, the stability in the energy of the EUV light may be badly influenced by the unstable pulse energy of the pulse laser beam 33 with which the target 27 is irradiated.

Figure 4A:
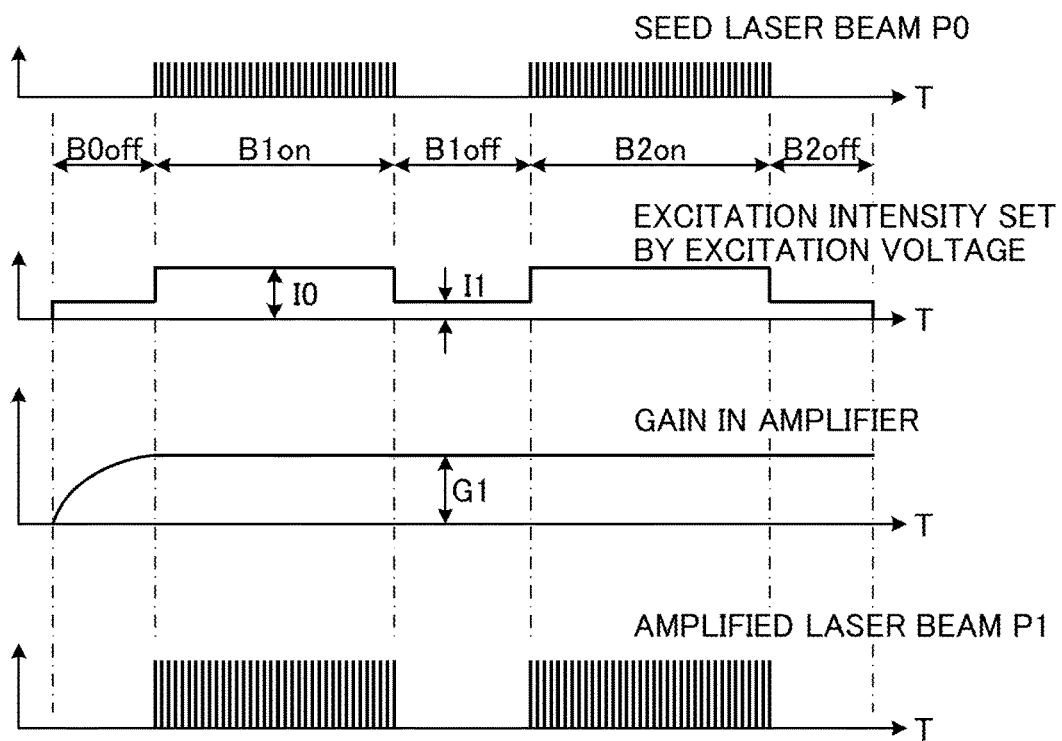
FIGS. 4A and 4B are timing charts of a laser apparatus according to a second comparative example.
Figure 4B:
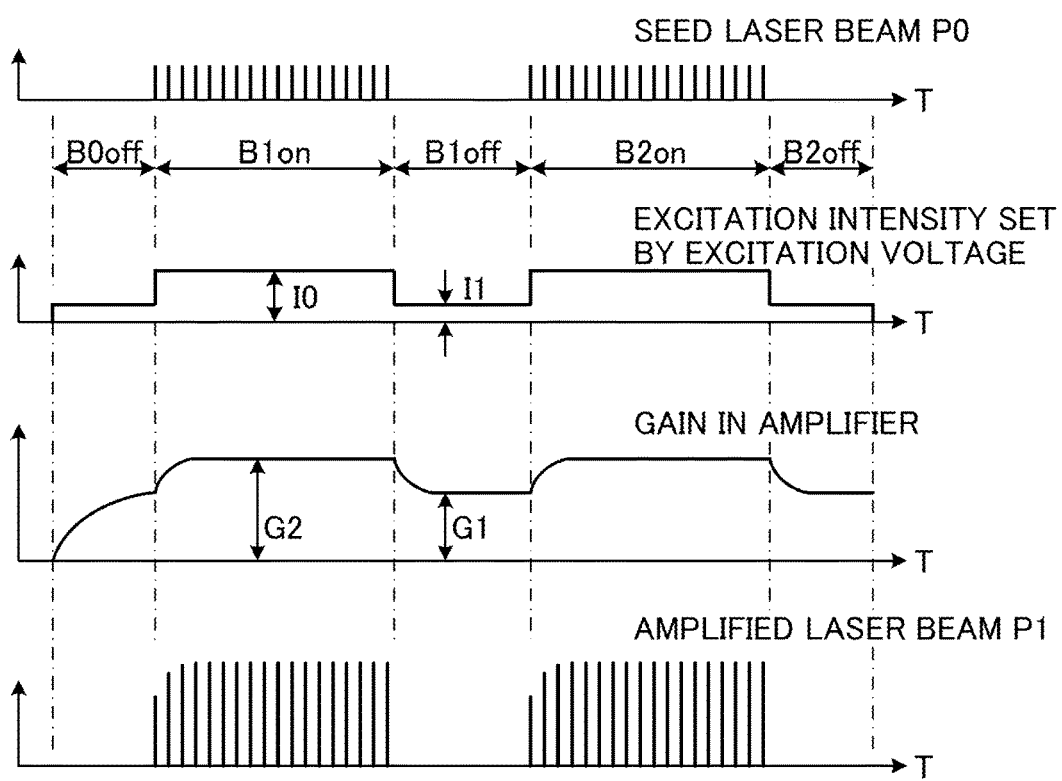

2.3.2 Case where Excitation Intensity in Suspension Period is Different from that in Burst Oscillation Period FIGS. 4A and 4B are timing charts of a laser apparatus according to a second comparative example. Each of the horizontal axes in FIGS. 4A and 4B shows the time T. Dot and dash lines parallel to the vertical axes in FIGS. 4A and 4B show that the events connected by each of the dot and dash lines occur at substantially the same time with each other. The laser apparatus 3 described with reference to FIG. 2 is also used in the second comparative example.

The trigger signal SG1 and the burst ON/OFF signal SG2 are substantially the same as those described with reference to FIG. 3. Illustration of the trigger signal SG1 and the burst ON/OFF signal SG2 is omitted in FIGS. 4A and 4B.

The seed laser beam P0 shown in FIG. 4A is substantially the same as that described with reference to FIG. 3.

In the second comparative example, the excitation intensity of the amplifier 300 in the burst oscillation periods B1ow and B2on is equal to the excitation intensity I0.

In contrast, the excitation intensity of the amplifier 300 in the suspension periods B0off, B1off, and B2off is an excitation intensity I1 lower than the excitation intensity I0. The excitation intensity I1 is set to a value such that the gain in the amplifier 300 in each of the suspension periods B0off, B1off, and B2off is kept to the gain G1. Namely, the excitation intensity is set such that, if the gain in the amplifier 300 is equal to the gain G1, the amount of energy supplied to the amplifier 300 by the excitation voltage is substantially balanced with the amount of energy spontaneously emitted from the amplifier 300.

As described above, in the second comparative example, the excitation intensity of the amplifier 300 is changed from that in the burst oscillation periods B1on and B2on to that in the suspension periods B0off, B1off, and B2off. This allows the gain in the amplifier 300 to be kept to the gain. G1 both in the burst oscillation periods B1on and B2on and the suspension periods B0off, B1off, and B2off.

However, if the repetition frequency of the seed laser beam P0 changes, a new problem may arise. Namely, the repetition frequency of the seed laser beam P0 shown in FIG. 4B is lower than that in FIG. 4A. In that case, the amount of consumed energy by amplifying the seed laser beam. P0 in FIG. 4B may be smaller than that in FIG. 4A. Accordingly, the gain in the amplifier 300 in the burst oscillation periods B1on and B2on may increase to a gain G2 larger than the gain G1.

In the suspension periods B0off, B1off, and B2off, the excitation intensity of the amplifier 300 decreases to the excitation intensity I1 and thus the gain in the amplifier 300 decreases to the gain G1.

In the case shown in FIG. 4B of the second comparative example, the gain in the amplifier 300 increases at the start of each of the burst oscillation periods E1an and B2on from the gain G1 to the gain G2. The pulse energy of the amplified laser beam P1 may thus be low at the start of each of the burst oscillation periods B1on and B2on, and then increase to a high value. In the second comparative example, the pulse energy of the amplified laser beam P1 in the burst oscillation periods B1on and B2on is thus unstable. In the EUV light generating system 11 described with reference to FIG. 1, the stability in the energy of the EUV light may be badly influenced by the unstable pulse energy of the pulse laser beam 33 with which the target 27 is irradiated.

Figure 5A:
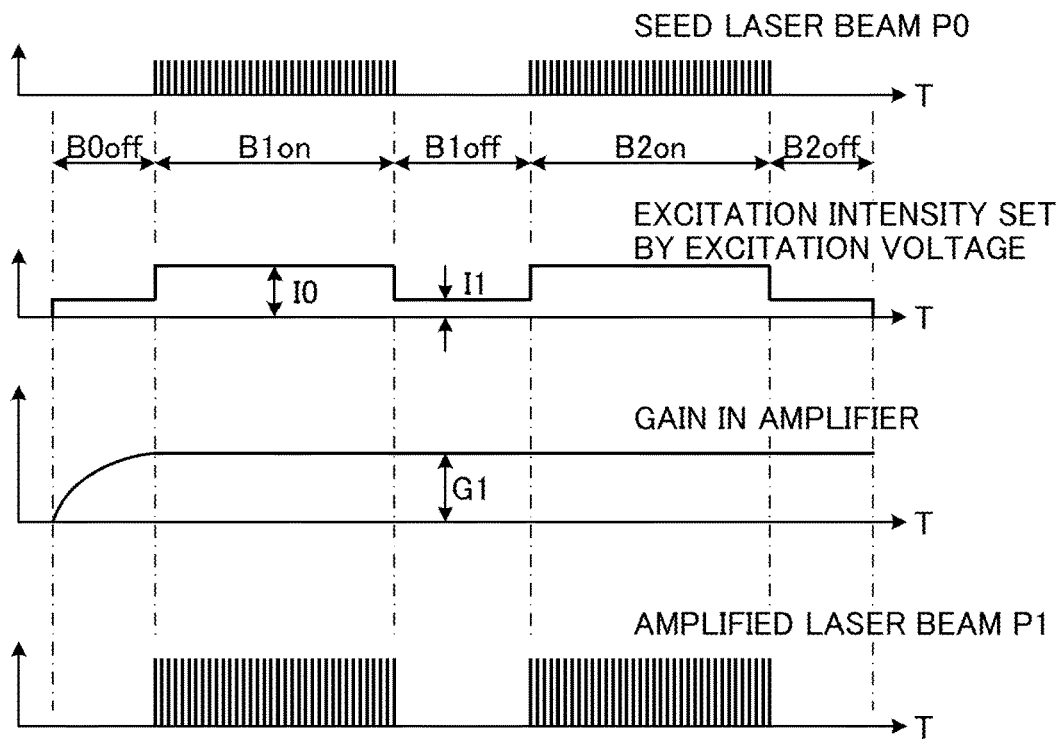
FIGS. 5A and 5B are timing charts of a laser apparatus according to the first embodiment of the present disclosure.
Figure 5B:
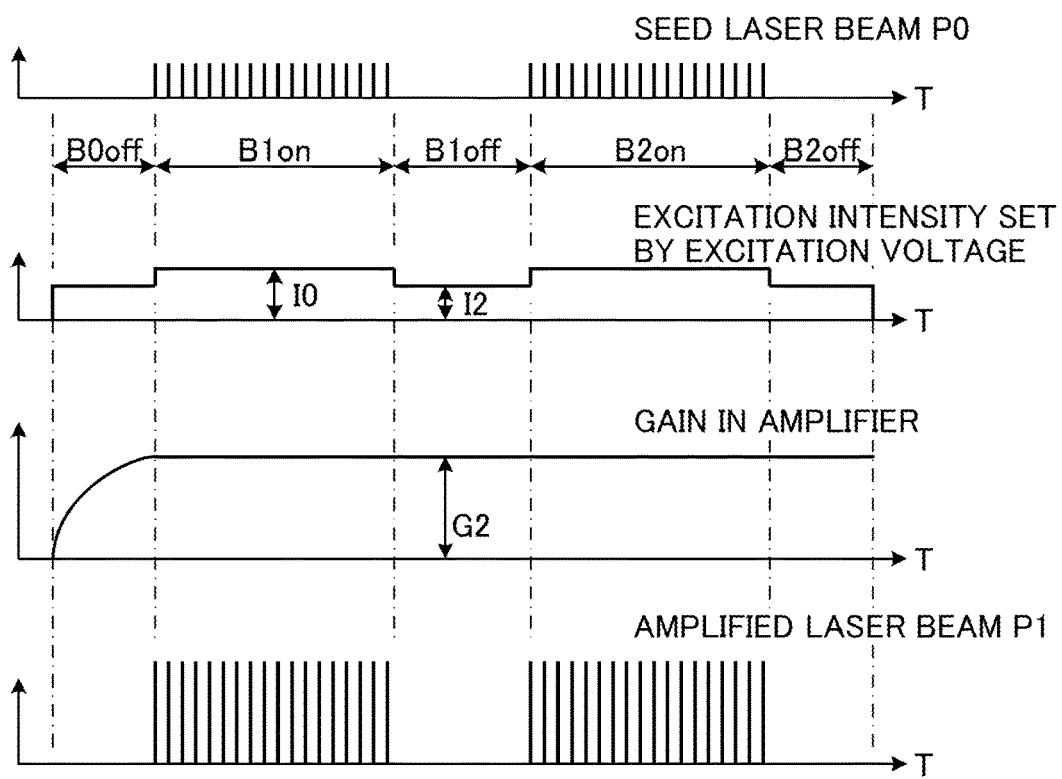

2.4 Laser Apparatus that Changes Excitation Intensity in Suspension Period According to Repetition Frequency in Burst Oscillation FIGS. 5A and 5B are timing charts of a laser apparatus according to the first embodiment of the present disclosure. Each of the horizontal axes in FIGS. 5A and 5B shows the time T. Dot and dash lines parallel to the vertical axes in FIGS. 5A and 5B show that the events connected by each of the dot and dash lines occur at substantially the same time with each other.

The trigger signal SG1 and the burst ON/OFF signal SG2 are substantially the same as those described with reference to FIG. 3. Illustration of the trigger signal SG1 and the burst ON/OFF signal SG2 is omitted in FIGS. 5A and 5B.

FIG. 5A is substantially the same as FIG. 4A of the second comparative example.

The seed laser beam P0 shown in FIG. 5B is substantially the same as that described with reference to FIG. 4B. Namely, the repetition frequency of the seed laser beam P0 shown in FIG. 5B is lower than that in FIG. 5A.

In FIG. 5B, the excitation intensity of the amplifier 300 in the suspension periods B0off, B1off, and B2off is an excitation intensity I2 lower than the excitation intensity I0 and higher than the excitation intensity I1. The excitation intensity I2 is set such that the gain in the amplifier 300 in the suspension periods B0off, B1off, and B2off is kept to the gain G2. Namely, the excitation intensity is set such that, if the gain in the amplifier 300 is equal to the gain G2, the amount of energy supplied to the amplifier 300 by the excitation voltage is substantially balanced with the amount of energy spontaneously emitted from the amplifier 300.

According to the first embodiment, even if the repetition frequency of the seed laser beam P0 changes, changes in the pulse energy of the amplified laser beam P1 may be suppressed. In the EUV light generating system 11 described with reference to FIG. 1, unintended changes in the energy of the EUV light, which is generated by irradiating the target 27 with the pulse laser beam 33, may be suppressed.

Here, the excitation intensity of the amplifier 300 in the burst oscillation periods B1on and B2on is the constant excitation intensity I0. However, the present disclosure is not limited to this. The excitation intensity in the amplifier 300 in the burst oscillation periods B1on and B2on may be changed, if necessary, to adjust the pulse energy of the amplified laser beam P1.

The excitation intensities I0, I1, and I2 may have the following relationship.

$$I1/I0 < I2/I0 \leq 1$$

Preferably, the excitation intensities may have the following relationship.

$$I1/I0 < I2/I0 < 1$$

The excitation intensity I0 may correspond to a first excitation intensity in the present disclosure.

The excitation intensity I1 may correspond to a third excitation intensity in the present disclosure.

The excitation intensity I2 may correspond to a second excitation intensity in the present disclosure.

The repetition frequency of the seed laser beam P0 shown in FIG. 5A may correspond to a second repetition frequency in the present disclosure.

The repetition frequency of the seed laser beam P0 shown in FIG. 5B may correspond to a first repetition frequency in the present disclosure.

2.5 Control of Excitation Intensity 2.5.1 First Example

Figure 6A:
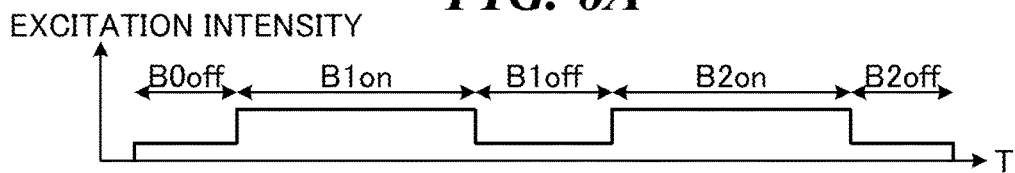
FIGS. 6A and 6B are graphs showing a first example of controlling excitation intensity in the first embodiment.
Figure 6B:
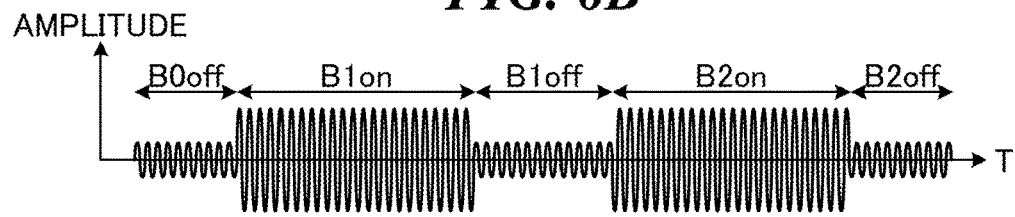

FIGS. 6A and 6B are graphs showing a first example of controlling the excitation intensity in the first embodiment. Each of the horizontal axes in FIGS. 6A and 6B shows the time T. FIG. 6A shows the excitation intensity set by the excitation voltage described with reference to FIG. 5A. FIG. 6B shows a waveform of the excitation voltage applied to the pair of electrodes in the first example.

As shown in FIG. 6B, the excitation voltage applied to the pair of electrodes has a high amplitude value in the burst oscillation periods B1on and B2on and a low amplitude value in the suspension periods B0off, B1off, and B2off, with a high-frequency. The amplitude value corresponds to the excitation intensity shown in FIG. 6A. The excitation intensity may thus be controlled by changing the amplitude value of the high-frequency excitation voltage.

2.5.2 Second Example

Figure 7A:
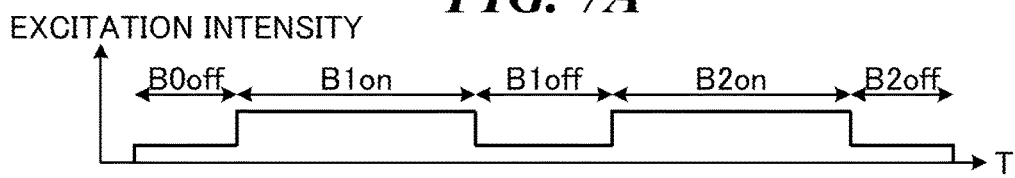
FIGS. 7A to 7F are graphs showing a second example of controlling the excitation intensity in the first embodiment.
Figure 7B:
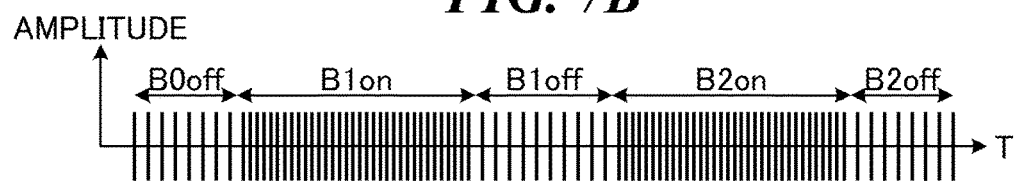
Figure 7C:
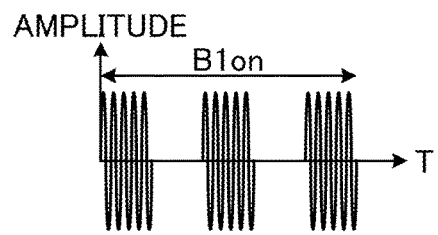
Figure 7D:
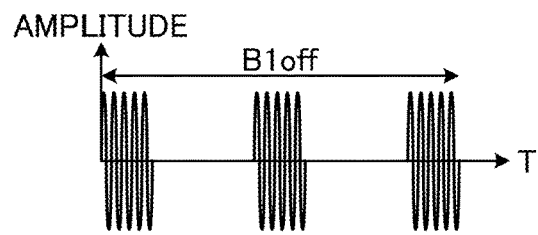

FIGS. 7A to 7F are graphs showing a second example of controlling the excitation intensity in the first embodiment. Each of the horizontal axes in FIGS. 7A to 7F shows the time T. FIG. 7A shows the excitation intensity set by the excitation voltage described with reference to FIG. 5A. FIG. 7B shows a schematic illustration of a waveform of the excitation voltage applied to the pair of electrodes in the second example. FIG. 7C shows details of the waveform by magnifying a part of the waveform in the burst oscillation period B1on in the schematic illustration shown in FIG. 73. FIG. 7D shows details of the waveform by magnifying a part of the waveform in the suspension period B1off in the schematic illustration shown in FIG. 7B.

As shown in FIGS. 7B, 7C, and 7D, the waveform of the excitation voltage applied to the pair of electrodes has a difference between a density in the burst oscillation period B1on and a density in the suspension period B1off. Namely, in the burst oscillation period B1on, waveform blocks of the high-frequency excitation voltage appear at a short periodic time. In the suspension period B1off, waveform blocks of the high-frequency excitation voltage appear at a long periodic time.

Figure 7E:
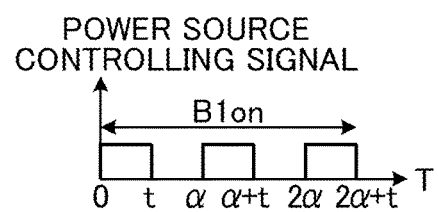
Figure 7F:
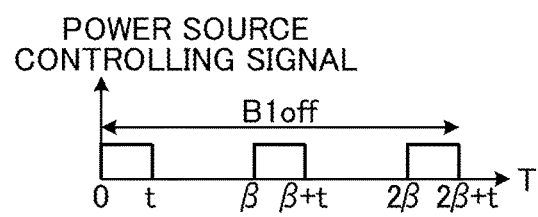

FIG. 7E shows a power source controlling signal to generate the waveform shown in FIG. 7C. FIG. 7F shows a power source controlling signal to generate the waveform shown in FIG. 7D. As shown in FIG. 7E, the power source controlling signal in the burst oscillation period B1on has a rectangular waveform having a pulse width t and a periodic time α. As shown in FIG. 7F, the power source controlling signal in the suspension period B1off has a rectangular waveform having the pulse width t and a periodic time β. According to these power source controlling signals inputted to the RF power source 310, the RE power source 310 generates the high-frequency excitation voltage having a constant amplitude value during a period where the power source controlling signal is in the ON state, and suspend generation of the excitation voltage during a period where the power source controlling signal is in the OFF state. This causes the excitation voltage generated by the RF power source 310 to have the waveforms shown in FIGS. 7C and 7D.

In the present disclosure, the following D1 or D2 obtained by dividing the pulse width t of the power source controlling signal by the periodic time α or β is referred to as a duty ratio.

$$D1=t/\alpha$$

$$D2=t/\beta$$

The duty ratio D2 in the suspension period B1off is lower than the duty ratio D1 in the burst oscillation period B1on. This allows the excitation intensity in the suspension period B1off to be low. The duty ratio corresponds to the excitation intensity shown in FIG. 7A. The excitation intensity may thus be controlled by changing the duty ratio.

The periodic time α of the power source controlling signal in the burst oscillation period B1on is preferably a reciprocal number of the repetition frequency of the seed laser beam P0 outputted from the master oscillator MO. For example, if the repetition frequency of the seed laser beam P0 is 100 kHz, the periodic time α is preferably set to 10 μs. The periodic time β of the power source controlling signal in the suspension period B1off is preferably set to a periodic time longer than the periodic time α. However, the pulse width t does not necessarily have a constant value and the periodic times α and β do not necessarily have different values to each other. The pulse width t in the burst oscillation period B1on may be different from that in the suspension period B1off.

FIGS. 7C and 7E illustrate the burst oscillation period B1on. However, the burst oscillation period B2on is substantially the same as illustrated in FIGS. 7C and 7E. FIGS. 7D and 7F illustrate the suspension period B1off. However, the suspension periods B0off and B2off are substantially the same as illustrated in FIGS. 7D and 7F.

2.6 Exemplary Configuration of Master Oscillator 2.6.1 First Example

Figure 8A:
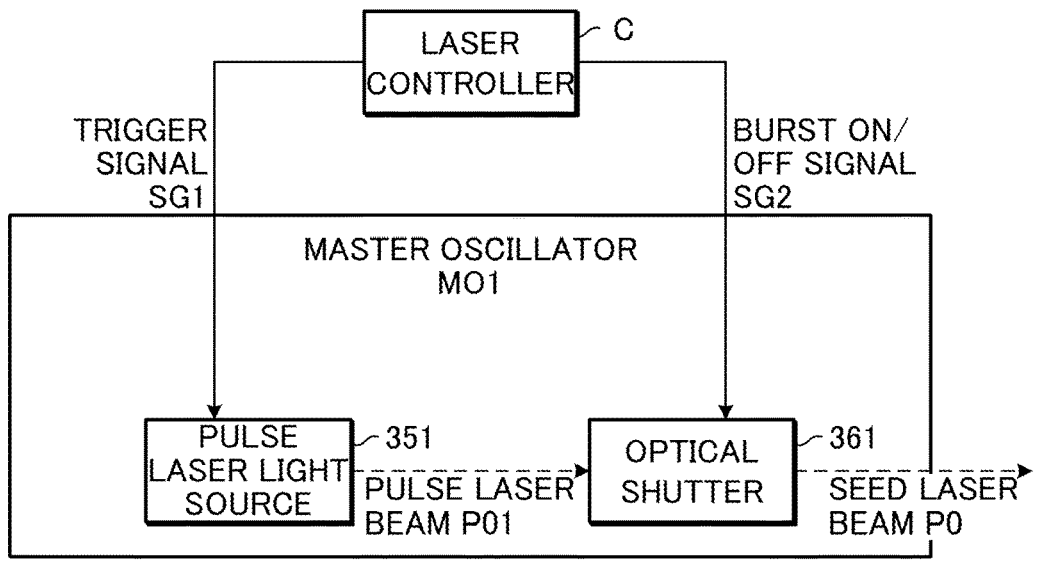
FIG. 8A is a block diagram showing a first example of a master oscillator in the first embodiment.

FIG. 8A is a block diagram showing a first example of the master oscillator in the first embodiment. The master oscillator MO1 according to the first example includes a pulse laser light source 351 and an optical shutter 361.

Figure 8B:
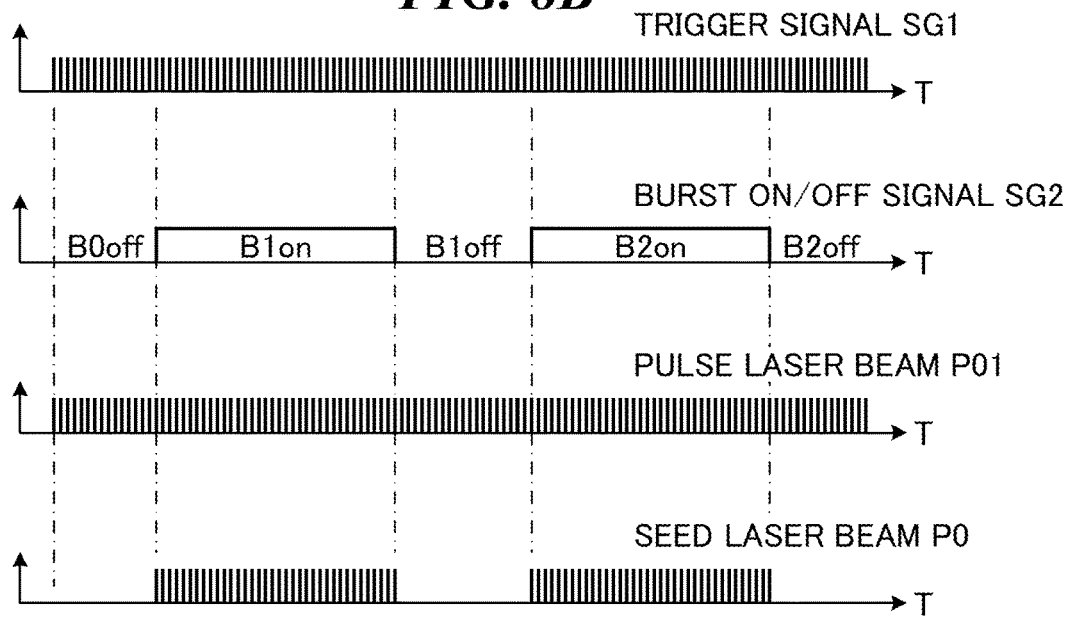
FIG. 8E is a timing chart of the master oscillator MO1 shown in FIG. 8A.
FIG. 8C is a block diagram showing an example of a pulse laser light source.

FIG. 8B is a timing chart of the master oscillator MO1 shown in FIG. 8A. Each of the horizontal axes in FIG. 8B shows the time T. Dot and dash lines parallel to the vertical axes in FIG. 8B show that the events connected by each of the dot and dash lines occur at substantially the same time with each other. The trigger signal SG1 and the burst ON/OFF signal SG2 shown in FIG. 8B are substantially the same as those described with reference to FIG. 3.

In FIG. 8A, the trigger signal SG1 is inputted to the pulse laser light source 351, and the burst ON/OFF signal SG2 is inputted to the optical shutter 361.

The pulse laser light source 351 outputs a pulse laser beam P01 at a predetermined repetition frequency defined by the trigger signal SG1.

The optical shutter 361 is provided in the optical path of the pulse laser beam P01 outputted from the pulse laser light source 351. The optical shutter 361 closes when the burst ON/OFF signal SG2 is in the OFF state, and opens when the burst ON/OFF signal SG2 is in the ON state. Thus, when the burst ON/OFF signal SG2 is in the OFF state, the pulse laser beam P01 does not substantially pass through the optical shutter 361. When the burst ON/OFF signal SG2 is in the ON state, the pulse laser beam P01 passes through the optical shutter 361. The pulse laser beam that is substantially the same as the seed laser beam P0 described with reference to FIG. 3 is thus outputted from the master oscillator MO1.

The optical shutter 361 may be a polarizing shutter where an unillustrated electro-optical element and an unillustrated polarizer are combined. Alternatively, the optical shutter 361 may be an optical switch using an acousto-optical element.

Figure 8C:
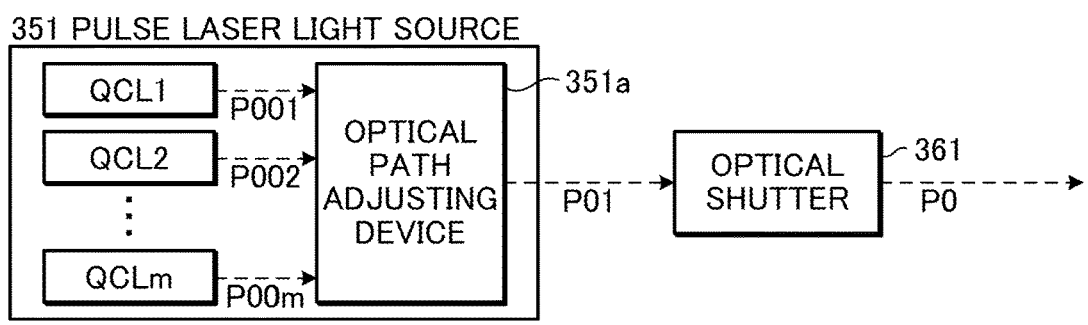

FIG. 8C is a block diagram showing an example of a pulse laser light source. The pulse laser light source 351 included in the master oscillator MO1 described with reference to FIG. 8A may include a plurality of quantum cascade lasers QCL1 to QCLm and an optical path adjusting device 351a.

Each of the quantum cascade lasers QCL1 to QCLm is a semiconductor laser having a configuration where quantum wells are cascade-connected. The wavelengths of the pulse laser beams P001 to P00m outputted from the respective quantum cascade lasers QCL1 to QCLm may be different from each other. However, these wavelengths are preferably adjusted to substantially coincide with the respective wavelengths of the pulse laser beam amplified in the $CO_2$ gas laser apparatus.

The optical path adjusting device 351a is provided in the optical paths of the pulse laser beams P001 to P00m outputted from the quantum cascade lasers QCL1 to QCLm. The optical path adjusting device 351a combines the optical paths of the pulse laser beams P001 to P00m to a single optical path to output the pulse laser beam P01 to the optical shutter 361.

Here, the pulse laser light source 351 includes a plurality of quantum cascade lasers QCL1 to QCLm. However, the present disclosure is not limited to this. The pulse laser light source 351 may be a $CO_2$ gas laser apparatus.

2.6.2 Second Example

Figure 9A:
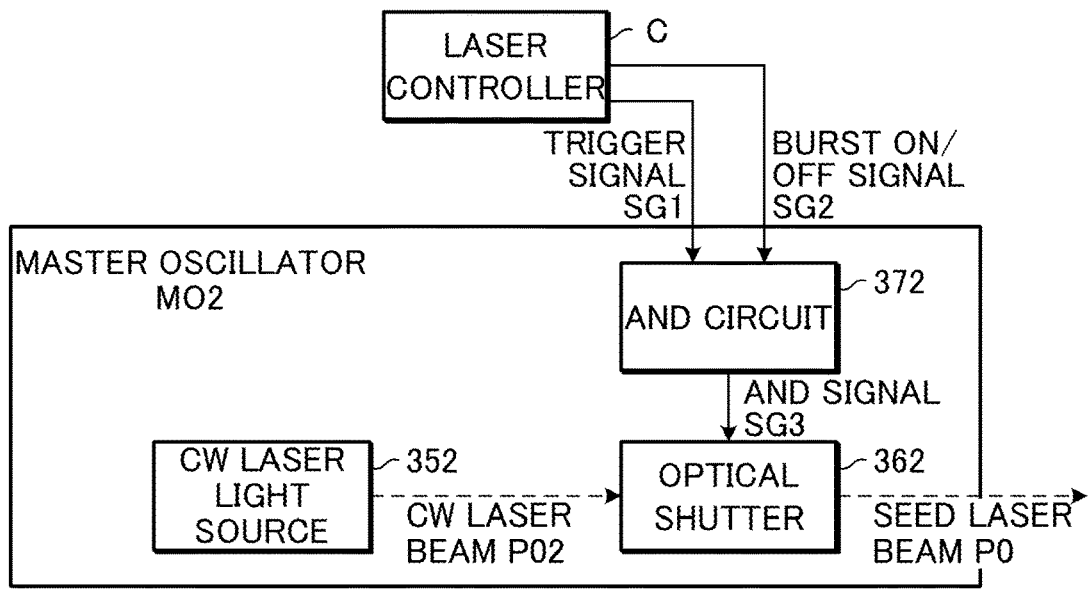
FIG. 9A is a block diagram showing a second example of the master oscillator in the first embodiment.

FIG. 9A is a block diagram showing a second example of the master oscillator of the first embodiment. The master oscillator MO2 according to the second example includes a CW laser light source 352, an optical shutter 362, and an AND circuit 372.

Figure 9B:
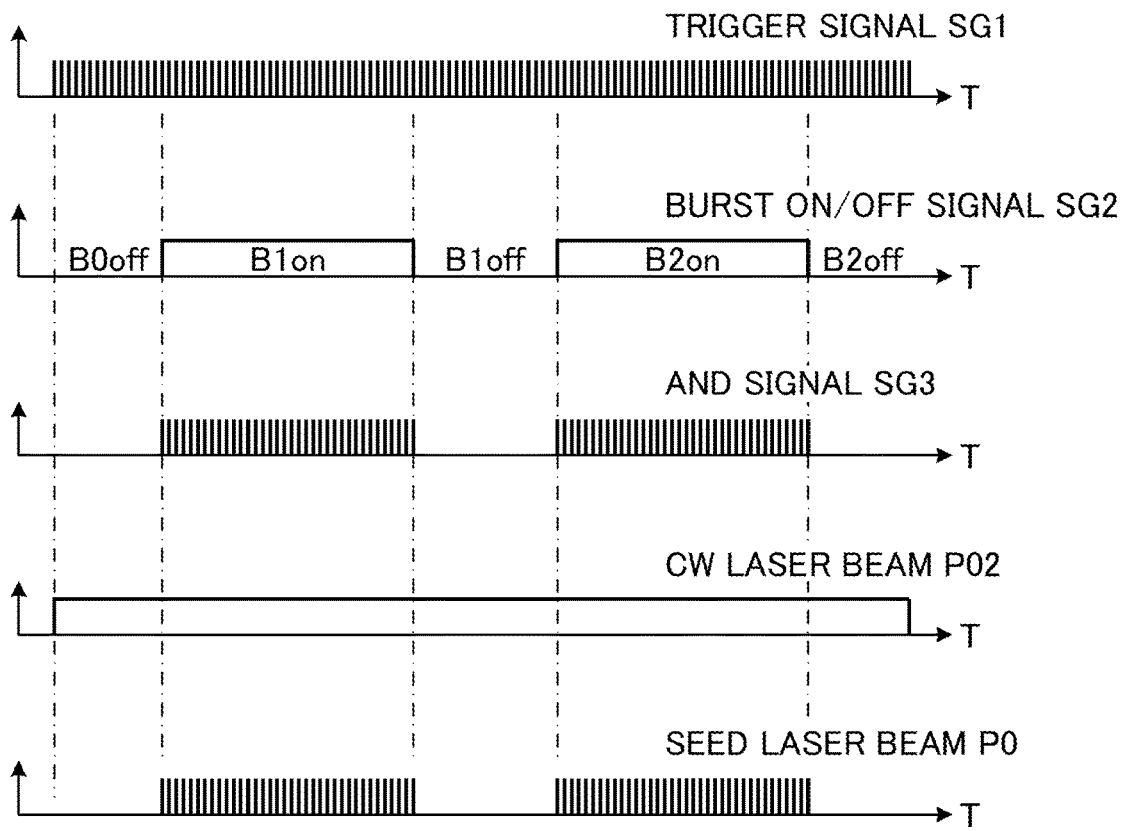
FIG. 9B is a timing chart of the master oscillator MO2 shown in FIG. 9A.

FIG. 9B is a timing chart of the master oscillator MO2 shown in FIG. 9A. Each of the horizontal axes in FIG. 9B shows the time T. Dot and dash lines parallel to the vertical axes in FIG. 9B show that the events connected by each of the dot and dash lines occur at substantially the same time with each other. The trigger signal SG1 and the burst ON/OFF signal SG2 shown in FIG. 9B are substantially the same as those described with reference to FIG. 3.

In FIG. 9A, both the trigger signal SG1 and the burst ON/OFF signal SG2 are inputted to the AND circuit 372. The AND circuit 372 outputs an AND signal SG3 based on the trigger signal SG1 and the burst ON/OFF signal SG2 to the optical shutter 362. As shown in FIG. 9B, the AND signal SG3 is an OFF state when the burst ON/OFF signal SG2 is in the OFF state. The AND signal SG3 is the same pulsed signal having the same repetition frequency with the trigger signal SG1 when the burst ON/OFF signal SG2 is in the ON state.

As shown in FIG. 9A, the CW laser light source 352 outputs a CW laser beam P02.

The optical shutter 362 is provided in an optical path of the CW laser beam P02 outputted from the CW laser light source 352. The optical shutter 362 closes when the AND signal SG3 is in the OFF state, and opens when the AND signal SG3 is in the ON state. When the burst ON/OFF signal SG2 is in the OFF state, the CW laser beam P02 does not substantially pass through the optical shutter 362. When the burst ON/OFF signal SG2 is in the ON state, a pulse laser beam having the same repetition frequency with the trigger signal SG1 is cut out from the CW laser beam P02 and outputted. The pulse laser beam that is substantially the same as the seed laser beam P0 described with reference to FIG. 3 is thus outputted from the master oscillator MO2.

The CW laser light source 352 may be a $CO_2$ gas laser apparatus that performs continuous oscillation.

The optical shutter 362 may be a polarizing shutter in which an unillustrated electro-optical element and an unillustrated polarizer are combined. Alternatively, the optical shutter 362 may be an optical switch using an acousto-optical element.

2.6.3 Third Example

Figure 10A:
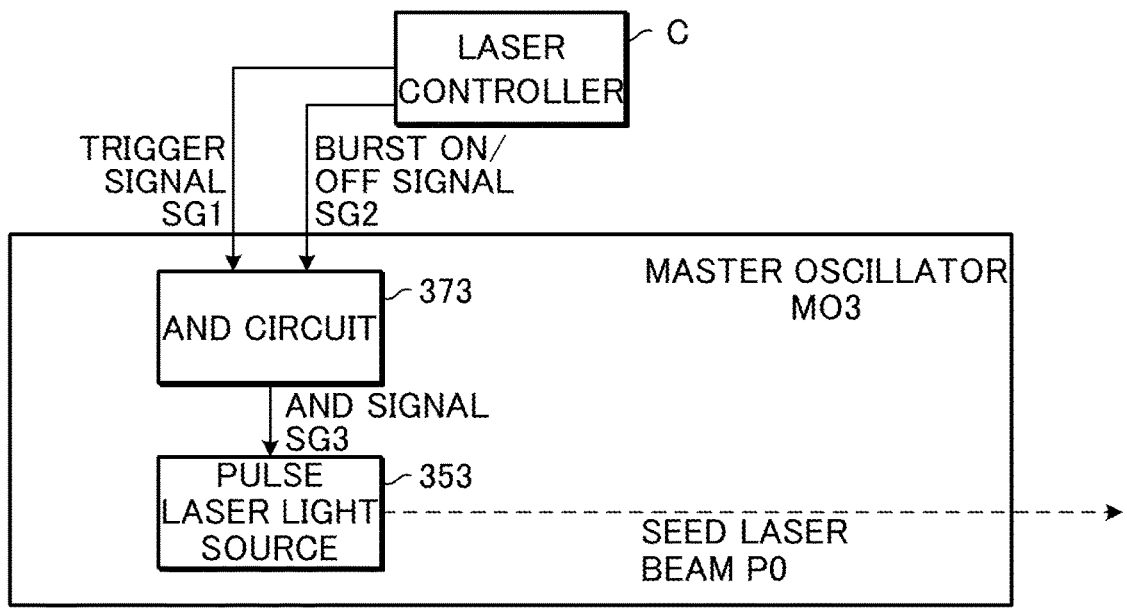
FIG. 10A is a block diagram showing a third example of the master oscillator in the first embodiment.

FIG. 10A is a block diagram showing a third example of the master oscillator in the first embodiment. The master oscillator MO3 according to the third example includes a pulse laser light source 353 and an AND circuit 373.

Figure 10B:
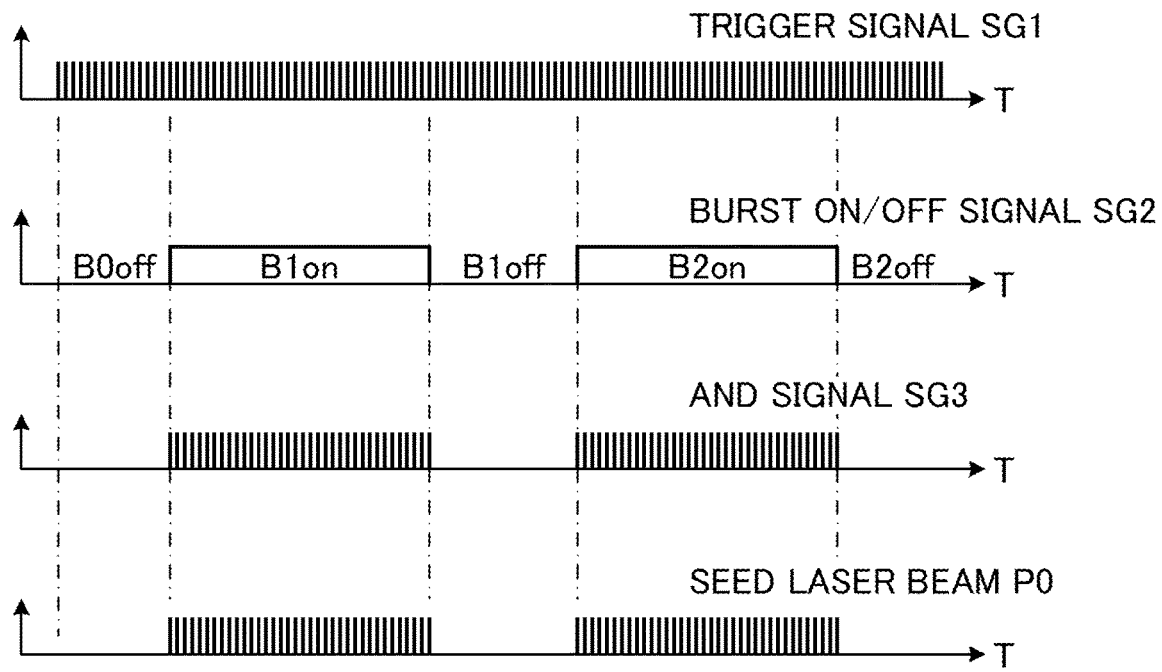
FIG. 10B is a timing chart of the master oscillator MO3 shown in FIG. 10A.

FIG. 10B is a timing chart of the master oscillator MO3 shown in FIG. 10A. Each of the horizontal axes in FIG. 10B shows the time T. Dot and dash lines parallel to the vertical axes in FIG. 10B show that the events connected by each of the dot and dash lines occur at substantially the same time with each other. The trigger signal SG1 and the burst ON/OFF signal SG2 shown in FIG. 10B are substantially the same as those described with reference to FIG. 3.

In FIG. 10A, both the trigger signal SG1 and the burst ON/OFF signal SG2 are inputted to the AND circuit 373. The AND circuit 373 outputs an AND signal SG3 based on the trigger signal SG1 and the burst ON/OFF signal SG2 to the pulse laser light source 353. The AND signal SG3 shown in FIG. 10B is substantially the same as that described with reference to FIG. 9B.

The pulse laser light source 353 outputs a seed laser beam P0 according to the AND signal SG3. Thus, when the burst ON/OFF signal SG2 is in the OFF state, the seed laser beam P0 is not outputted. When the burst ON/OFF signal SG2 is in the ON state, the seed laser beam P0 having the same repetition frequency with the trigger signal SG1 is outputted. A pulse laser beam that is substantially the same as the seed laser beam P0 described with reference to FIG. 3 is thus outputted from the master oscillator MO3.

The pulse laser light source 353 may be a $CO_2$ gas laser apparatus.

Figure 11A:
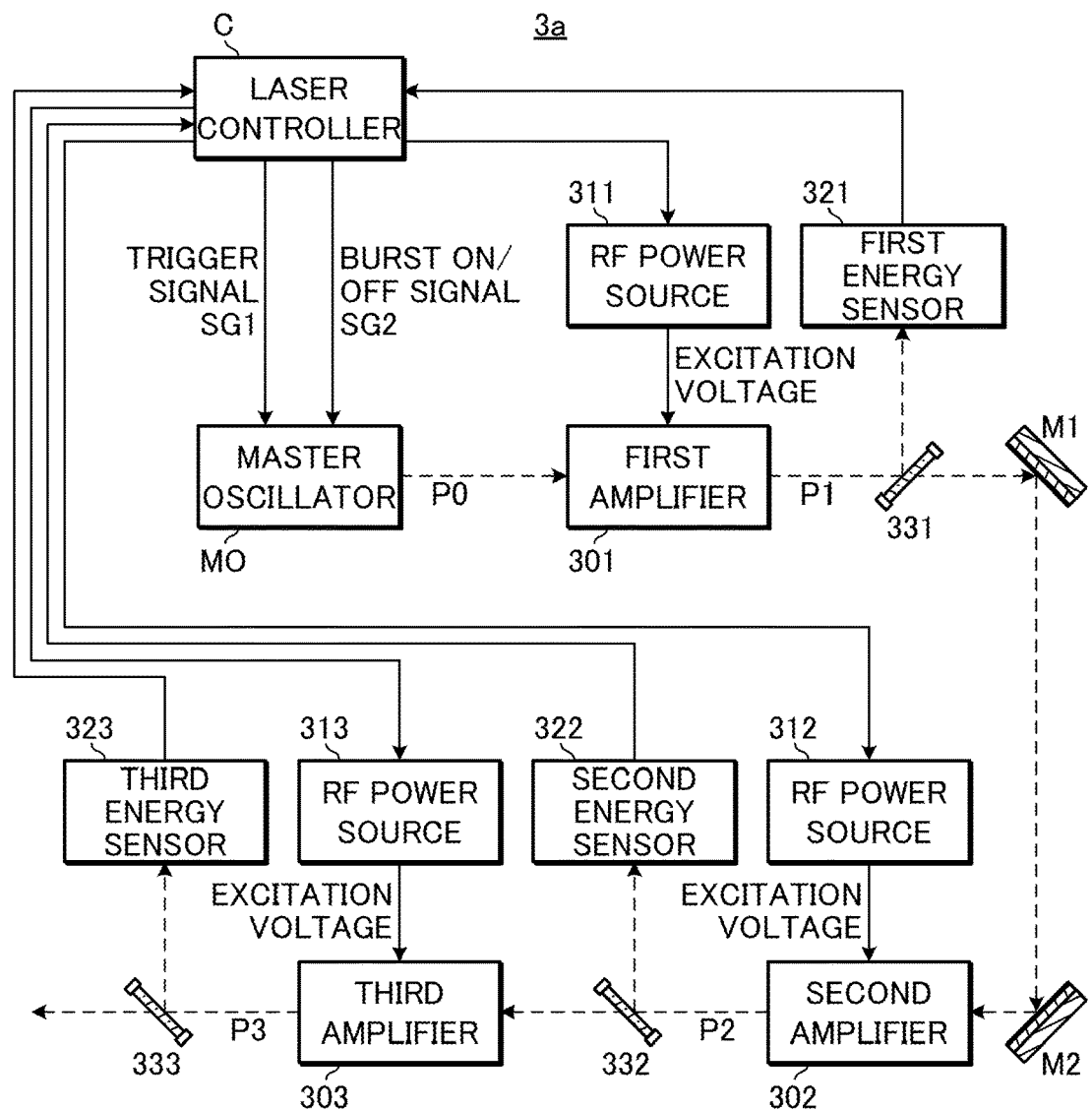
FIG. 11A is a block diagram of a laser apparatus according to a second embodiment of the present disclosure.

3. Laser Apparatus that Changes Excitation Intensity of Plurality of Amplifiers 3.1 Configuration of Laser Apparatus FIG. 11A is a block diagram of a laser apparatus according to a second embodiment of the present disclosure. A laser apparatus 3a shown in FIG. 11A includes a master oscillator MO, first amplifier 301, a second amplifier 302, a third amplifier 303, and a laser controller C. The laser apparatus 3a further includes. RF power sources 311 to 313, first to third energy sensors 321 to 323, and beam splitters 331 to 333.

The first amplifier 301 is provided in an optical path of the seed laser beam P0 outputted from the master oscillator MO. The first amplifier 301 is configured to amplify the seed laser beam P0 according to the excitation voltage applied by the RF power source 311 and output the amplified laser beam P1.

The second amplifier 302 is provided in an optical path of the amplified laser beam P1 outputted from the first amplifier 301. The second amplifier 302 further amplifies the amplified laser beam P1 according to the excitation voltage applied by the RF power source 312 and outputs an amplified laser beam P2.

The third amplifier 303 is provided in an optical path of the amplified laser beam P2 outputted from the second amplifier 302. The third amplifier 303 further amplifies the amplified laser beam P2 according to the excitation voltage applied by the RF power source 313 and outputs an amplified laser beam P3.

The beam splitter 331 is provided in the optical path of the amplified laser beam P1 between the first amplifier 301 and the second amplifier 302. The beam splitter 331 transmits the amplified laser beam P1 at a high transmittance, and reflects a part of the amplified laser beam P1 to the first energy sensor 321. The first energy sensor 321 receives the reflected part of the amplified laser beam P1 to detect the pulse energy of the amplified laser beam P1. The first energy sensor 321 outputs the detected pulse energy of the amplified laser beam P1 to the laser controller C. High-reflective mirrors M1 and M2 may be provided in the optical path of the amplified laser beam P1 between the first amplifier 301 and the second amplifier 302.

The beam splitter 332 is provided in the optical path of the amplified laser beam P2 between the second amplifier 302 and the third amplifier 303. The beam splitter 332 transmits the amplified laser beam P2 at a high transmittance, and reflects a part of the amplified laser beam. P2 to the second energy sensor 322. The second energy sensor 322 receives the reflected part of the amplified laser beam P2 to detect the pulse energy of the amplified laser beam P2. The second energy sensor 322 outputs the detected pulse energy of the amplified laser beam P2 to the laser controller C.

The beam splitter 333 is provided in an optical path of the amplified laser beam P3 outputted from the third amplifier 303. The beam splitter 333 transmits the amplified laser beam P3 at a high transmittance, and reflects a part of the amplified laser beam P3 to the third energy sensor 323. The third energy sensor 323 receives the reflected part of the amplified laser beam P3 and detects the pulse energy of the amplified laser beam P3. The third energy sensor 323 outputs the detected pulse energy of the amplified laser beam. P3 to the laser controller C.

3.2 Configuration of Energy Sensor

Figure 11B:
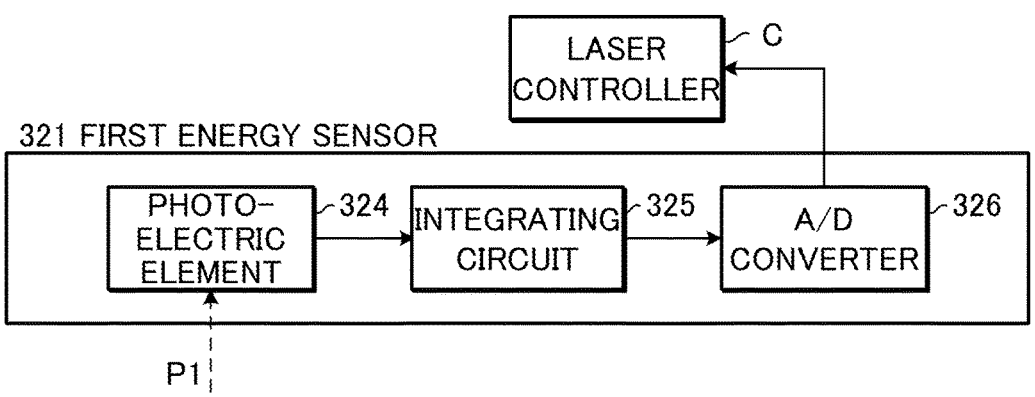
FIG. 11B is a block diagram showing an exemplary configuration of a first energy sensor shown in FIG. 11A.

FIG. 11B is a block diagram showing an exemplary configuration of the first energy sensor shown in FIG. 11A. The first energy sensor 321 includes a photoelectric element 324, an integrating circuit 325, and an A/D converter 326.

The photoelectric element 324 receives the reflected part of the amplified laser beam. P1, generates a voltage proportional to the light intensity of the amplified laser beam P1, and outputs the voltage to the integrating circuit 325. The integrating circuit 325 performs time-integration of the voltage received from the photoelectric element 324 to generate a voltage proportional to the pulse energy of the amplified laser beam P1, and outputs the generated voltage to the A/D converter 326. The A/D converter 326 converts the voltage received from the integrating circuit 325 to digital data. The first energy sensor 321 thus measures the pulse energy of the amplified laser beam. P1 to output the pulse energy to the laser controller C.

The configuration of each of the second energy sensor 322 and the third energy sensor 323 is substantially the same as that of the first energy sensor 321.

3.3 Operation of Controller

With reference back to FIG. 11A, the laser controller C sets the excitation intensity of each of the first amplifier 301, the second amplifier 302, and the third amplifier 303 in the suspension period based on the repetition frequency of the trigger signal SG1. As described in the first embodiment, upon increasing of the repetition frequency of the trigger signal SG1, which determines the repetition frequency of the seed laser beam P0, the laser controller C reduces the excitation intensity in the suspension period. Upon decreasing of the repetition frequency of the trigger signal SG1, the laser controller C raises the excitation intensity in the suspension period.

Figures 12A, 12B:
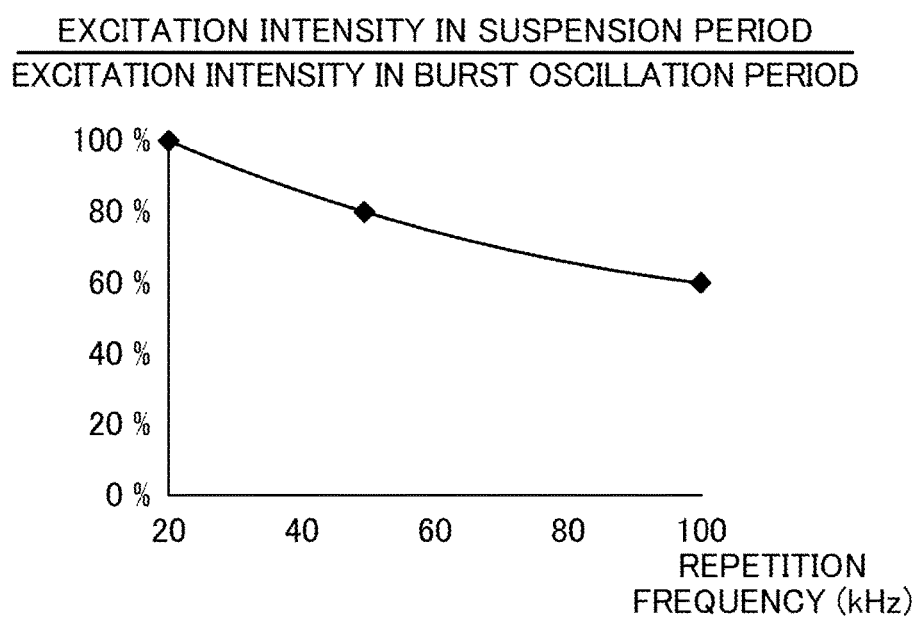
FIG. 12A describes a first example of setting of the excitation intensity in a suspension period based on a repetition frequency.
FIG. 12B describes a second example of setting of the excitation intensity in the suspension period based on the repetition frequency.

FIG. 12A describes a first example of setting of the excitation intensity in the suspension period based on the repetition frequency. FIG. 12A shows table data on the excitation intensity of each amplifier in association with the repetition frequency of the trigger signal SG1. The storage device that stores the table data may be a storage memory 1005 described below. The storage memory 1005 may correspond to a storage medium in the present disclosure. FIG. 12A shows, for each amplifier, a ratio of the excitation intensity in the suspension period to the excitation intensity in the burst oscillation period.

The laser controller C reads the excitation intensity in the suspension period from the table data shown in FIG. 12A, based on the repetition frequency of the trigger signal SG1. The laser controller C then sets the excitation intensity in the suspension period.

As shown in FIG. 12A, the higher the repetition frequency is, the lower the excitation intensity in the suspension period to be set is. When the repetition frequency is for example 100 kHz, the excitation intensity in the suspension period is set higher in the downstream amplifier than in the upstream amplifier.

FIG. 12B describes a second example of setting of the excitation intensity in the suspension period based on the repetition frequency. FIG. 12B shows an approximate curve of a relationship between the repetition frequency of the trigger signal SG1 and the excitation intensity of the amplifiers. The storage device may store an approximate equation representing such approximate curve. The storage device may be the storage memory 1005 described below. FIG. 12B shows a ratio of the excitation intensity of the amplifiers in the suspension period to that in the burst oscillation period.

The laser controller C calculates the excitation intensity in the suspension period based on the repetition frequency of the trigger signal SG1, using the approximate curve shown in FIG. 12B or the approximate equation. The laser controller C then sets the excitation intensity in the suspension period.

As shown in FIG. 12B, the higher the repetition frequency is, the lower the excitation intensity in the suspension period to be set is. FIG. 12B shows that a value of the excitation intensity common to all amplifiers is set. However, the excitation intensity in the suspension period may be higher in the downstream amplifier than in the upstream amplifier.

With reference back to FIG. 11A, the laser controller C evaluates a deviation of the pulse energy of the amplified laser beam P1 measured by the first energy sensor 321. The laser controller C calculates the excitation intensity of the first amplifier 301 in the suspension period based on the results of the evaluation and sends the power source controlling signal to the RF power source 311.

Similarly, the laser controller C evaluates a deviation of the pulse energy of the amplified laser beam P2 measured by the second energy sensor 322. The laser controller C calculates the excitation intensity of the second amplifier 302 in the suspension period based on the results of the evaluation and sends the power source controlling signal to the RF power source 312.

Similarly, the laser controller C evaluates a deviation of the pulse energy of the amplified laser beam P3 measured by the third energy sensor 323. The laser controller C calculates the excitation intensity of the third amplifier 303 in the suspension period based on the results of the evaluation and sends the power source controlling signal to the RF power source 313.

3.4 Setting Process of Excitation Intensity

Figure 13:
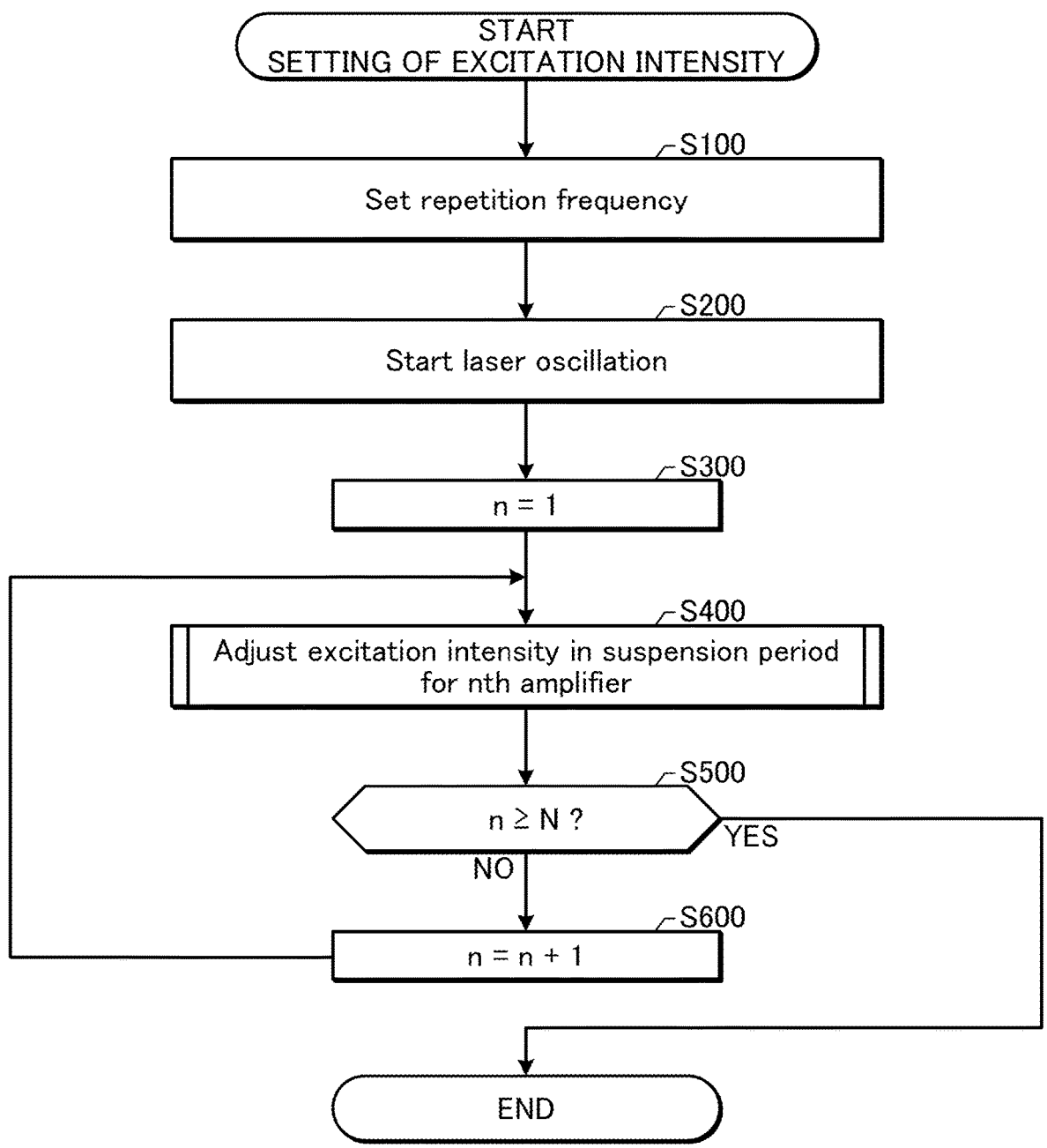
FIG. 13 is a flowchart showing a setting process of the excitation intensity performed by a laser controller shown in FIG. 11A.

FIG. 13 is a flowchart showing a setting process of the excitation intensity performed by the laser controller shown in FIG. 11A. The laser controller C sets the excitation intensity of each of the first to third amplifiers 301 to 303 in the following process. The process shown in FIG. 13 may be performed during the suspension of outputting the pulse laser beam to the EUV light generating apparatus 1 described with reference to FIG. 1, or performed in parallel with outputting the pulse laser beam to the EUV light generating apparatus 1.

First, at S100, the laser controller C sets the repetition frequency of the trigger signal SG1. The laser controller C may receive a command value of the repetition frequency from the EUV light generation controller 5 described with reference to FIG. 1, to set the repetition frequency of the trigger signal SG1. Alternatively, based on the detection signal of the target 27 from the target sensor 4 described with reference to FIG. 1, the laser controller C may set the repetition frequency of the trigger signal SG1. Still alternatively, if the output of the pulse laser beam to the EUV light generating apparatus 1 is suspended, the laser controller C may set a desired repetition frequency regardless of the signals from other devices.

Next, at S200, the laser controller C sends the signals to the master oscillator MO to start the laser oscillation. The master oscillator MO alternately repeats the burst oscillation to perform output of the seed laser beam P0 at a predetermined repetition frequency, and the suspension of the burst oscillation to suspend the output of the seed laser beam P0 at the predetermined repetition frequency.

Next, at S300, the laser controller C sets the value of the counter n to 1. In this flowchart, the counter n is used to identify the individual amplifiers.

Next, at S400, the laser controller C adjusts the excitation intensity in the suspension period for an nth amplifier. Details of this process will be described with reference to FIG. 14.

Next, at S500, the laser controller C determines whether the value of the counter n has reached a maximum value N. The maximum value N corresponds to the number of amplifiers included in the laser apparatus. In the example described with reference to FIG. 11A, N=3. However, the value of N may be larger or smaller than this.

If the value of the counter n has not reached the maximum value N (S500: NO), the laser controller C adds 1 to the value of the counter n to update it, at S600. Then, the laser controller C returns to S400 to repeat the subsequent process. The laser controller C thus adjusts the excitation intensity of each of the amplifiers one by one in the order from the first amplifier 301 to the downstream amplifiers.

If the value of the counter n has reached the maximum value N (S500: YES), the laser controller C ends the process of this flowchart.

3.5 Adjusting Process of Excitation Intensity

Figure 14:
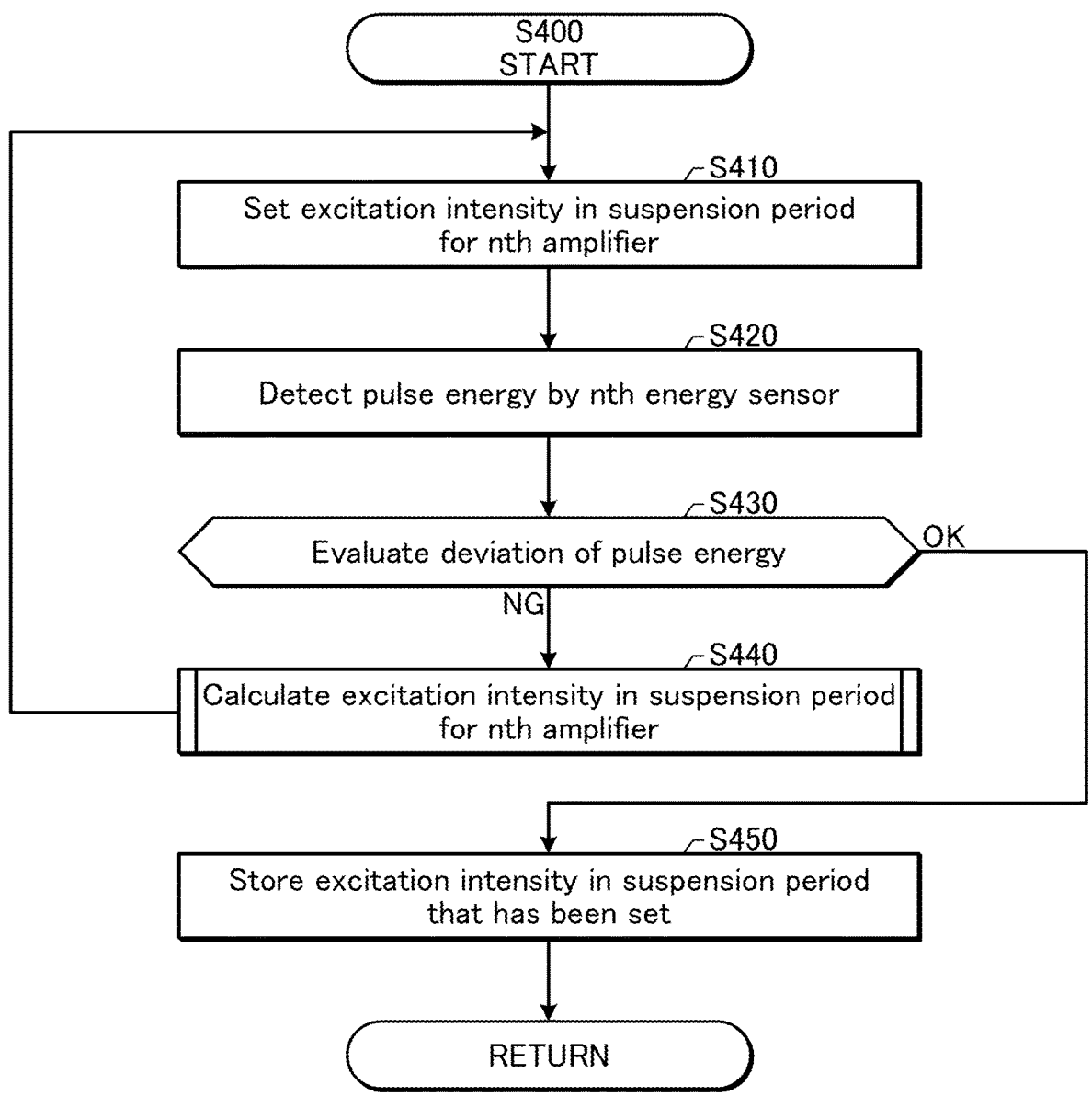
FIG. 14 is a flowchart showing a process of adjusting the excitation intensity shown in FIG. 13.

FIG. 14 is a flowchart showing a process of adjusting the excitation intensity shown in FIG. 13. The process shown in FIG. 14 is performed by the laser controller C as a subroutine of S400 shown in FIG. 13.

First, at S410, the laser controller C sets an excitation intensity in the suspension period for the nth amplifier. The excitation intensity set at S410 corresponds to a fourth excitation intensity in the present disclosure.

The excitation intensity in the suspension period is set based on, for example, a repetition frequency of the trigger signal SG1 set at S100. Setting the excitation intensity based on the repetition frequency is performed, for example, as described with reference to FIGS. 12A and 12E. First, for example, a ratio of the excitation intensity in the suspension period to the excitation intensity in the burst oscillation period is set. Then, the excitation intensity in the burst oscillation period is multiplied by the ratio to obtain and set the excitation intensity in the suspension period.

If a value of the excitation intensity is calculated at S440 described below, the value calculated at S440 is set as the excitation intensity in the suspension period.

Next, at S420, the laser controller C detects, by an nth energy sensor, the pulse energy of the pulse laser beam outputted from the nth amplifier.

Next, at S430, the laser controller C evaluates a deviation of the pulse energy detected at S420. The deviation of the pulse energy may be evaluated, for example, by comparing an average value of the pulse energy of a predetermined number of pulses at the start of the burst oscillation period and an average value of the pulse energy of the pulses in the burst oscillation period. Alternatively, the deviation of the pulse energy may be evaluated, for example, by using an absolute value of a difference between the average value of the pulse energy of the predetermined number of pulses at the start of the burst oscillation period and the average value of the pulse energy of the pulses in the burst oscillation period. Still alternatively, the deviation of the pulse energy may be evaluated by using a ratio of the absolute value described above to the average value of the pulse energy of the pulses in the burst oscillation period. The predetermined number of pulses will be described with reference to FIG. 15. If the deviation of the pulse energy is larger than a predetermined value, the laser controller C determines that the deviation is NG. If the deviation of the pulse energy is equal to or smaller than the predetermined value, the laser controller C determines that the deviation is OK. For example, if the ratio of the absolute value described above to the average value of the pulse energy in the burst oscillation period is higher than 5%, the laser controller C determines that the deviation is NG. If the ratio is 5% or lower, the laser controller C determines that the deviation is OK. Alternatively, the deviation of the pulse energy may be evaluated based on a variance or a standard deviation of the value of the pulse energy.

If the deviation of the pulse energy is NG, the laser controller C calculates, at S440, an excitation intensity in the suspension period for the nth amplifier. Details of this process will be described with reference to FIG. 15. The excitation intensity calculated at S440 may correspond to a fifth excitation intensity in the present disclosure.

If the deviation of the pulse energy is OK, the laser controller C stores, at S450, the excitation intensity of the nth amplifier in the suspension period set at S410 in the storage device. The storage device may be the storage memory 1005 described below. After S450, the laser controller C ends the process of this flowchart to return to the process of FIG. 13.

3.6 Calculating Process of Excitation Intensity

Figure 15:
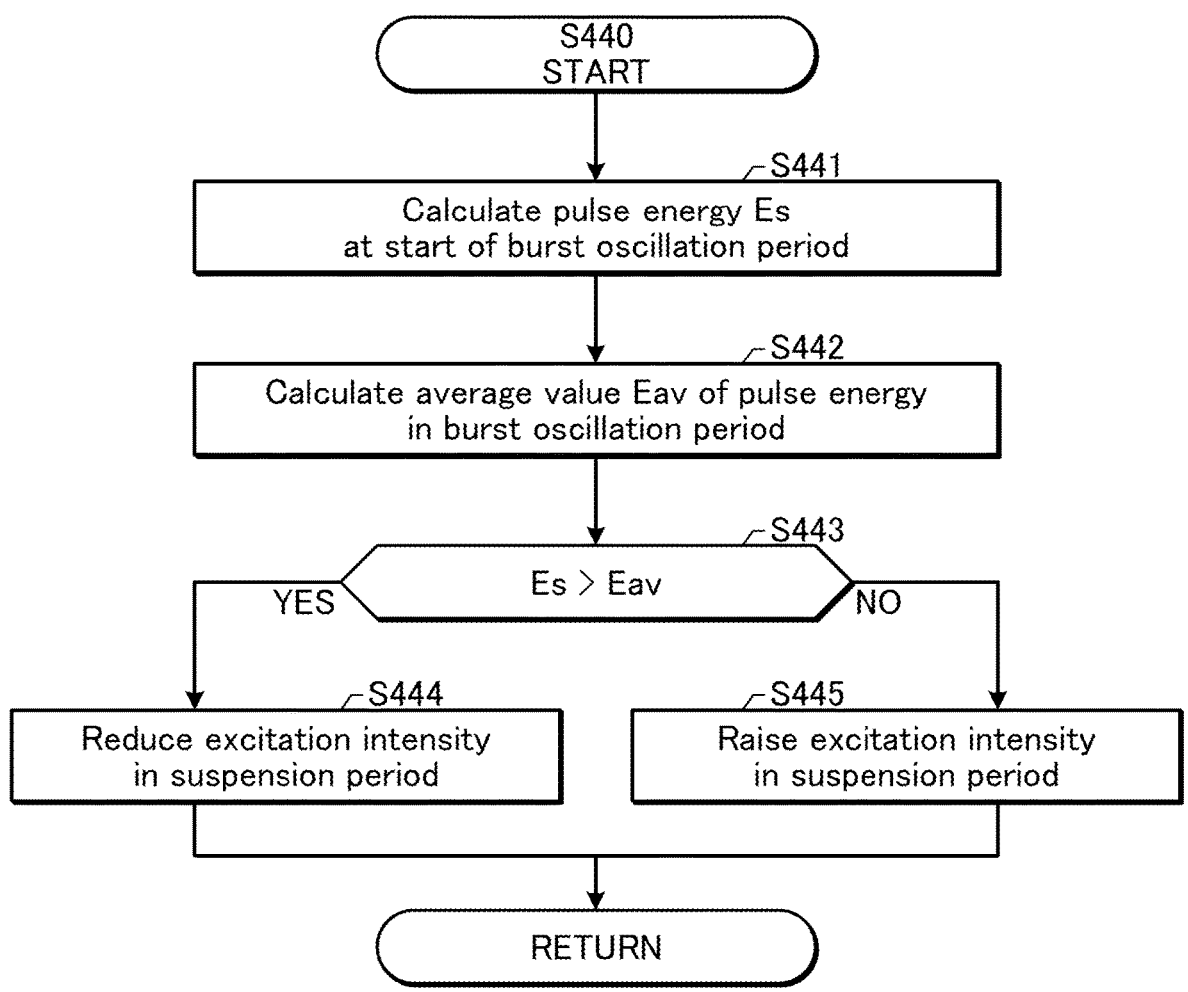
FIG. 15 is a flowchart showing a process of calculating the excitation intensity shown in FIG. 14.

FIG. 15 is a flowchart showing a process of calculating the excitation intensity shown in FIG. 14. The process shown in FIG. 15 is performed by the laser controller C as a subroutine of S440 shown in FIG. 14.

First, at S441, the laser controller C calculates, based on the data on the pulse energy detected by the nth energy sensor at S420 described with reference to FIG. 14, pulse energy Es at the start of the burst oscillation period. The pulse energy Es at the start of the burst oscillation period may be an average value of the pulse energy of the predetermined number of pulses at the start of the burst oscillation period. Here, the predetermined number of pulses may be one pulse or more, 20 pulses or less. The predetermined number of pulses may be, for example, 5 pulses.

Next, at S442, the laser controller C calculates an average value Eav of the pulse energy in the burst oscillation period.

Next, at S443, the laser controller C compares the pulse energy Es at the start of the burst oscillation period and the average value Eav of the pulse energy in the burst oscillation period.

If Es>Eav (S443: YES), the laser controller C calculates, at S444, an excitation intensity of the nth amplifier in the suspension period to reduce it to a value lower than the present setting value. For example, the laser controller C subtracts a positive constant value from the present ratio of the excitation intensity in the suspension period to the excitation intensity in the burst oscillation period to obtain a new ratio. Then, the laser controller C multiplies the excitation intensity in the burst oscillation period by the new ratio to obtain the new excitation intensity in the suspension period. Here, the positive constant value may be, for example, 5%. Namely, if the present ratio of the excitation intensity in the suspension period to the excitation intensity in the burst oscillation period is 70%, the new ratio will be 65%. Alternatively, for example, the laser controller C may subtract a positive constant value from the present setting value of the excitation intensity in the suspension period to obtain the new excitation intensity in the suspension period. Still alternatively, for example, the laser controller C may multiply the present setting value of the excitation intensity in the suspension period by a constant value smaller than 1 to obtain the new excitation intensity in the suspension period. Here, the constant value smaller than 1 may be, for example, 0.95.

If Es≤Eav (S443: NO), the laser controller C calculates, at S445, the excitation intensity of the nth amplifier in the suspension period to raise it to a value higher than the present setting value. For example, the laser controller C adds a positive constant value to the present ratio of the excitation intensity in the suspension period to the excitation intensity in the burst oscillation period to obtain a new ratio. Then, the laser controller C multiplies the excitation intensity in the burst oscillation period by the new ratio to obtain the new excitation intensity in the suspension period. Here, the positive constant value may be, for example, 5%. Namely, if the present ratio of the excitation intensity in the suspension period to the excitation intensity in the burst oscillation period is 70%, the new ratio will be 75%. Alternatively, for example, the laser controller C may add a positive constant value to the present setting value of the excitation intensity in the suspension period to obtain the new excitation intensity in the suspension period. Still alternatively, for example, the laser controller C may multiply the present setting value of the excitation intensity in the suspension period by a constant value larger than 1 to obtain the new excitation intensity in the suspension period. Here, the constant value larger than 1 may be, for example, 1.05.

After S444, or after S445, the laser controller C ends the process of this flowchart to return to the process of FIG. 14.

According to the process described above, not only by the process of setting the excitation intensity in the suspension period based on the repetition frequency but also by the process described with reference to FIG. 15, fine adjustment to reduce deviation of the pulse energy may be achieved.

4. Configuration of Controller

Figure 16:
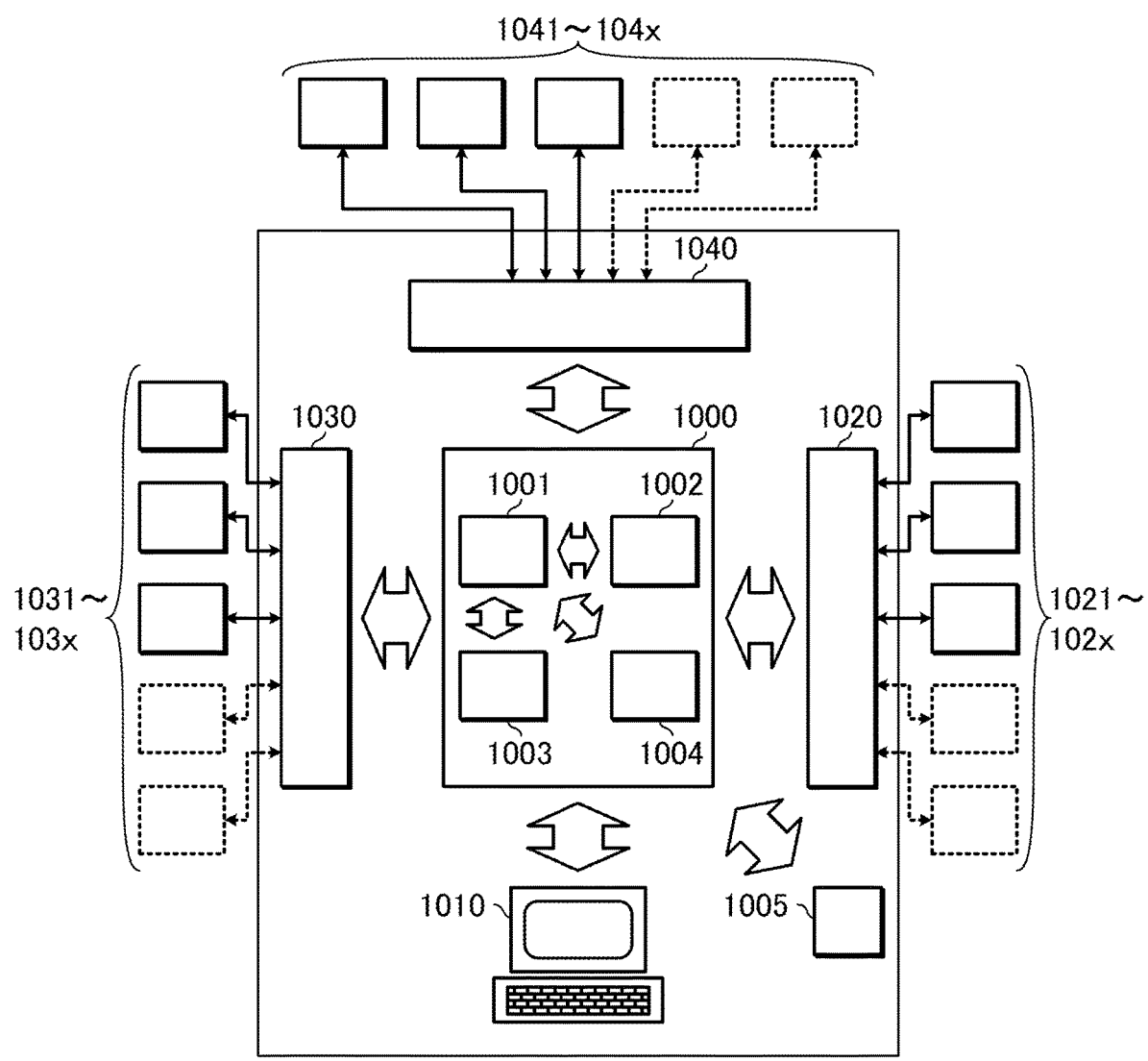
FIG. 16 is a block diagram showing a general configuration of a controller.

FIG. 16 is a block diagram showing a general configuration of a controller.

Controllers of the above-described embodiments, such as the laser controller C, may be configured by general-purpose control devices, such as computers or programmable controllers. For example, the controllers may be configured as follows. For example, the controllers may be configured as follows.

Configuration

The controllers may each be configured by a processor 1000, and a storage memory 1005, a user interface 1010, a parallel input/output (I/O) controller 1020, a serial I/O controller 1030, and an analog-to-digital (A/D) and digital-to-analog (D/A) converter 1040 which are connected to the processor 1000. The processor 1000 may be configured by a central processing unit (CPU) 1001, and a memory 1002, a timer 1003, and a graphics processing unit (GPU) 1004 which are connected to the CPU 1001.

Operation

The processor 1000 may read a program stored in the storage memory 1005, execute the read program, read data from the storage memory 1005 in accordance with the program, or store data in the storage memory 1005.

The parallel I/O controller 1020 may be connected to devices 1021 to 102x with which it may communicate through parallel I/O ports. The parallel I/O controller 1020 may control digital-signal communication through the parallel I/O ports while the processor 1000 executes the program.

The serial I/O controller 1030 may be connected to devices 1031 to 103x with which it may communicate through serial I/O ports. The serial I/O controller 1030 may control digital-signal communication through the serial I/O ports while the processor 1000 executes the program.

The A/D and D/A converter 1040 may be connected to devices 1041 to 104x with which it may communicate through analog ports. The A/D and D/A converter 1040 may control analog-signal communication through the analog ports while the processor 1000 executes the program.

The user interface 1010 may be configured to display the progress of the program being executed by the processor 1000 in accordance with instructions from an operator, or to allow the processor 1000 to stop the execution of the program or perform an interrupt in accordance with instructions from the operator.

The CPU 1001 of the processor 1000 may perform arithmetic processing of the program. The memory 1002 may temporarily store the program being executed by the CPU 1001 or temporarily store data in the arithmetic processing. The timer 1003 may measure time or elapsed time and output it to the CPU 1001 in accordance with the program being executed. When image data is inputted to the processor 1000, the GPU 1004 may process the image data in accordance with the program being executed and output the results to the CPU 1001.

The devices 1021 to 102x, which are connected through the parallel I/O ports to the parallel I/O controller 1020, may be used to send and receive the trigger signal or signals showing time to and from the EUV light generation controller 5, other controllers, or the like.

The devices 1031 to 103x, which are connected through the serial I/O ports to the serial I/O controller 1030, may be used to send and receive data to and from the EUV light generation controller 5, other controllers, or the like.

The devices 1041 to 104*x*, which are connected through the analog ports to the A/D and D/A converter 1040, may be various sensors such as the target sensor 4 or the like.

The controllers thus configured may be capable of realizing the operations described in the embodiments.

5. Supplementary Explanation

The above descriptions are intended to be only illustrative rather than being limiting. Accordingly, it will be clear to those skilled in the art that various changes may be made to the embodiments of the present disclosure without departing from the scope of the appended claims.

The terms used in this specification and the appended claims are to be interpreted as not being limiting. For example, the term "include" or "included" should be interpreted as not being limited to items described as being included. Further, the term "have" should be interpreted as not being limited to items described as being had. Furthermore, the modifier "a" or "an" as used in this specification and the appended claims should be interpreted as meaning "at least one" or "one or more".

The invention claimed is:

1. A laser apparatus comprising:
a master oscillator configured to alternately repeat burst oscillation to perform output of a pulse laser beam at a predetermined repetition frequency and suspension of the burst oscillation to suspend the output of the pulse laser beam at the predetermined repetition frequency;
an amplifier provided in an optical path of the pulse laser beam outputted from the master oscillator;
a power source configured to supply electric power to the amplifier;
a controller configured to
control the power source such that an excitation intensity of the amplifier in a burst oscillation period performing the burst oscillation is a first excitation intensity,
control the power source such that, if the predetermined repetition frequency is a first repetition frequency, an excitation intensity of the amplifier in a suspension period suspending the burst oscillation is a second excitation intensity equal to or lower than the first excitation intensity, and
control the power source such that, if the predetermined repetition frequency is a second repetition frequency higher than the first repetition frequency, the excitation intensity of the amplifier in the suspension period is a third excitation intensity lower than the second excitation intensity;
a storage medium configured to store data on a ratio of the excitation intensity of the amplifier in the suspension period to the excitation intensity of the amplifier in the burst oscillation period for each one of the predetermined repetition frequencies, and
an energy sensor configured to detect pulse energy of the pulse laser beam outputted from the amplifier, wherein
the amplifier includes a first amplifier and a second amplifier positioned downstream from the first amplifier provided in an optical path of a pulse laser beam outputted from the first amplifier, and
the controller:
acquires the pulse energy detected by the energy sensor in a situation where the repetition frequency in the burst oscillation period and the excitation intensity of the amplifier in the suspension period are set and laser oscillation is performed;
calculates, based on the pulse energy, the relationship between the repetition frequency in the burst oscillation period and the excitation intensity of the amplifier in the suspension period to store the relationship in the storage medium; and
controls the power source such that a ratio of the excitation intensity of the first amplifier in the suspension period to the excitation intensity of the first amplifier in the burst oscillation period is lower than a ratio of the excitation intensity of the second amplifier in the suspension period to the excitation intensity of the second amplifier in the burst oscillation period.

2. The laser apparatus according to claim 1, wherein the controller controls the power source such that, the higher the predetermined repetition frequency is, the lower the excitation intensity of the amplifier in the suspension period is.

3. The laser apparatus according to claim 1, wherein
the master oscillator
includes a laser light source configured to output the pulse laser beam at the predetermined repetition frequency and an optical shutter provided in an optical path of the pulse laser beam outputted from the laser light source,
opens the optical shutter to perform the burst oscillation, and
closes the optical shutter to suspend the burst oscillation.

4. The laser apparatus according to claim 1, wherein
the master oscillator
includes a laser light source configured to output the pulse laser beam and an optical shutter provided in an optical path of the pulse laser beam outputted from the laser light source, and
performs the burst oscillation by opening and closing the optical shutter at the predetermined repetition frequency.

5. The laser apparatus according to claim 4, wherein the master oscillator closes the optical shutter to suspend the burst oscillation.

6. The laser apparatus according to claim 1, wherein the controller controls the power source in the suspension period based on the predetermined repetition frequency and the data stored in the storage medium.

7. The laser apparatus according to claim 1, wherein the controller reads the excitation intensity of the amplifier in the suspension period from the storage medium based on the predetermined repetition frequency.

8. The laser apparatus according to claim 1, wherein the controller calculates the excitation intensity of the amplifier in the suspension period based on the predetermined repetition frequency and the data stored in the storage medium.

9. The laser apparatus according to claim 1, wherein the controller calculates the relationship between the repetition frequency in the burst oscillation period and the excitation intensity of the amplifier in the suspension period such that a deviation of the pulse energy detected by the energy sensor in the burst oscillation period is smaller than a predetermined value to store the relationship in the storage medium.

10. The laser apparatus according to claim 1, wherein the controller sets the excitation intensity of the amplifier in the suspension period to a fourth excitation intensity, calculates an average value of the pulse energy detected by the energy sensor in the burst oscillation period, and calculates, if the average value is higher than the pulse energy detected by the energy sensor at the start of the burst oscillation period, a relationship between the repetition frequency in the burst oscillation period and a fifth excitation intensity of the amplifier in the suspension period such that the fifth excitation intensity is lower than the fourth excitation intensity to store the relationship in the storage medium.

11. The laser apparatus according to claim 1, wherein the controller sets the excitation intensity of the amplifier in the suspension period to a fourth excitation intensity, calculates an average value of the pulse energy detected by the energy sensor in the burst oscillation period, and calculates, if the average value is lower than the pulse energy detected by the energy sensor at the start of the burst oscillation period, a relationship between the repetition frequency in the burst oscillation period and a fifth excitation intensity of the amplifier in the suspension period such that the fifth excitation intensity is higher than the fourth excitation intensity to store the relationship in the storage medium.

12. The laser apparatus according to claim 1, wherein
the energy sensor includes a first energy sensor configured to detect pulse energy of the pulse laser beam outputted from the first amplifier and a second energy sensor configured to detect pulse energy of a pulse laser beam outputted from the second amplifier, and
the controller
acquires a first value of the pulse energy detected by the first energy sensor in a situation where the repetition frequency in the burst oscillation period and an excitation intensity of the first amplifier in the suspension period are set and the laser oscillation is performed, and calculates, based on the first value of the pulse energy, a relationship between the repetition frequency in the burst oscillation period and the excitation intensity of the first amplifier in the suspension period to store the relationship in the storage medium, and then
acquires a second value of the pulse energy detected by the second energy sensor in a situation where the repetition frequency in the burst oscillation period and an excitation intensity of the second amplifier in the suspension period are set and the laser oscillation is performed, and calculates, based on the second value of the pulse energy, a relationship between the repetition frequency in the burst oscillation period and the excitation intensity of the second amplifier in the suspension period to store the relationship in the storage medium.

13. An extreme ultraviolet light generating system comprising:
a target supply unit configured to output a target toward a predetermined region; and
a laser apparatus configured to output a pulse laser beam with which the target is irradiated,
the laser apparatus including:
a master oscillator configured to alternately repeat burst oscillation to perform output of the pulse laser beam at a predetermined repetition frequency and suspension of the burst oscillation to suspend the output of the pulse laser beam at the predetermined repetition frequency;
an amplifier provided in an optical path of the pulse laser beam outputted from the master oscillator;
a power source configured to supply electric power to the amplifier;
an energy sensor configured to detect pulse energy of the pulse laser beam outputted from the amplifier; and
a controller configured to control the power source such that an excitation intensity of the amplifier in a burst oscillation period performing the burst oscillation is a first excitation intensity,
control the power source such that, if the predetermined repetition frequency is a first repetition frequency, an excitation intensity of the amplifier in a suspension period suspending the burst oscillation is a second excitation intensity equal to or lower than the first excitation intensity,
control the power source such that, if the predetermined repetition frequency is a second repetition frequency higher than the first repetition frequency, the excitation intensity of the amplifier in the suspension period is a third excitation intensity lower than the second excitation intensity; and
control the power source such that a ratio of the excitation intensity of the amplifier in the suspension period to the excitation intensity of the amplifier in the burst oscillation period is based on the repetition frequency, and the excitation intensity of the amplifier in the suspension period is based on the ratio of the excitation intensity of the amplifier in the suspension period to the excitation intensity of the amplifier in the burst oscillation period and based on the excitation intensity of the amplifier in the burst oscillation period, wherein
the amplifier includes a first amplifier and a second amplifier positioned downstream from the first amplifier provided in an optical path of a pulse laser beam outputted from the first amplifier, and
the controller:
acquires the pulse energy detected by the energy sensor in a situation where the repetition frequency in the burst oscillation period and the excitation intensity of the amplifier in the suspension period are set and laser oscillation is performed;
calculates, based on the pulse energy, the relationship between the repetition frequency in the burst oscillation period and the excitation intensity of the amplifier in the suspension period to store the relationship in the storage medium; and
controls the power source such that a ratio of the excitation intensity of the first amplifier in the suspension period to the excitation intensity of the first amplifier in the burst oscillation period is lower than a ratio of the excitation intensity of the second amplifier in the suspension period to the excitation intensity of the second amplifier in the burst oscillation period.

14. The extreme ultraviolet light generating system according to claim 13, further comprising
a target sensor configured to detect the target outputted from the target supply unit and output a detection signal, wherein
the controller sets the predetermined repetition frequency based on the detection signal outputted from the target sensor and outputs a trigger signal to the master oscillator such that the master oscillator outputs the pulse laser beam at the predetermined repetition frequency.

15. The laser apparatus according to claim 1, wherein the controller sets the ratio of the excitation intensity of the amplifier in the suspension period to the excitation intensity of the amplifier in the burst oscillation period based on the repetition frequency, and sets the excitation intensity of the amplifier in the suspension period based on the ratio of the excitation intensity of the amplifier in the suspension period to the excitation intensity of the amplifier in the burst oscillation period and based on the excitation intensity of the amplifier in the burst oscillation period.

* * * * *